(12) United States Patent
Tsapatsis et al.

(10) Patent No.: US 10,005,077 B2
(45) Date of Patent: Jun. 26, 2018

(54) ZEOLITE NANOSHEET MEMBRANE

(75) Inventors: Michael Tsapatsis, Edina, MN (US);
Kumar Varoon Agrawal, Minneapolis, MN (US)

(73) Assignee: REGENTS OF THE UNIVERSITY OF MINNESOTA, Minneapolis, MN (US)

( * ) Notice: Subject to any disclaimer, the term of this patent is extended or adjusted under 35 U.S.C. 154(b) by 377 days.

(21) Appl. No.: 14/130,589

(22) PCT Filed: Jul. 3, 2012

(86) PCT No.: PCT/US2012/045411
§ 371 (c)(1),
(2), (4) Date: Mar. 18, 2014

(87) PCT Pub. No.: WO2013/006623
PCT Pub. Date: Jan. 10, 2013

(65) Prior Publication Data
US 2015/0045206 A1 Feb. 12, 2015

Related U.S. Application Data

(60) Provisional application No. 61/504,214, filed on Jul. 3, 2011.

(51) Int. Cl.
*B01J 31/26* (2006.01)
*B01D 53/22* (2006.01)
(Continued)

(52) U.S. Cl.
CPC ............ *B01J 31/26* (2013.01); *B01D 53/228* (2013.01); *B01D 67/0046* (2013.01);
(Continued)

(58) Field of Classification Search
CPC .. B01J 37/009; B01J 37/0221; B01J 37/0009; B01J 37/0018; B01D 67/0076; B01D 71/028
See application file for complete search history.

(56) References Cited

U.S. PATENT DOCUMENTS 5,278,115 A 1/1994 Kresge et al.
5,453,298 A 9/1995 Gavalas et al.
(Continued)

FOREIGN PATENT DOCUMENTS

EP 2 297 037 A2 3/2011
EP 2 138 222 B1 6/2011
(Continued)

OTHER PUBLICATIONS

Barth et al., "Synthesis of new MCM-36 derivatives pillared with alumina or magnesia-alumina," *Journal of Materials Chemistry*, 2002; 12(2):369-373. Available online Jan. 3, 2002.

(Continued)

*Primary Examiner* — Alex A Rolland
(74) *Attorney, Agent, or Firm* — Mueting, Raasch & Gebhardt, PA

(57) ABSTRACT

Oxide materials, thin films, coatings, and methods of preparing the same are disclosed herein. In certain embodiments the oxide material can have an MWW type framework or an MFI type framework. In one embodiment, the method includes: providing a suspension of an exfoliated layered oxide material in a solvent; and filtering the suspension through a porous support to provide a film of the oxide material, optionally directly on the porous support. Secondary grown films of the oxide material and methods of preparing the same are also provided. Thin zeolite films are attractive for a wide range of applications including molecular sieve membranes and catalytic membrane reactors, per- (Continued)

meation barriers, low dielectric constant materials for microelectronics and sensor components for selective sensing.

9 Claims, 12 Drawing Sheets

(51) Int. Cl.
  B01D 67/00     (2006.01)
  B01D 69/12     (2006.01)
  B01D 71/02     (2006.01)
  C01B 39/02     (2006.01)
  B01J 37/02     (2006.01)
  C08K 3/34      (2006.01)
  C30B 29/16     (2006.01)
  B82Y 30/00     (2011.01)
  B82Y 40/00     (2011.01)

(52) U.S. Cl.
  CPC ..... *B01D 67/0051* (2013.01); *B01D 67/0076* (2013.01); *B01D 69/12* (2013.01); *B01D 71/024* (2013.01); *B01D 71/027* (2013.01); *B01D 71/028* (2013.01); *B01J 37/0215* (2013.01); *C01B 39/026* (2013.01); *C08K 3/34* (2013.01); *C30B 29/16* (2013.01); *B01D 2323/08* (2013.01); *B01D 2325/04* (2013.01); *B01J 2231/00* (2013.01); *B82Y 30/00* (2013.01); *B82Y 40/00* (2013.01)

(56) References Cited

U.S. PATENT DOCUMENTS

| | | | |
|---|---|---|---|
| 6,863,983 B2 * | 3/2005 | Tsapatsis | B01D 53/228 428/131 |
| 7,087,288 B2 | 8/2006 | Tsapatsis et al. | |
| 7,357,836 B2 | 4/2008 | Tsapatsis et al. | |
| 7,909,917 B2 | 3/2011 | Nonaka et al. | |
| 7,938,894 B2 | 5/2011 | Oyama et al. | |
| 7,951,738 B2 | 5/2011 | Chida et al. | |
| 8,501,068 B2 | 8/2013 | Tsapatsis et al. | |
| 2003/0176752 A1 * | 9/2003 | Levin | B01J 21/10 585/640 |
| 2008/0213883 A1 | 9/2008 | Davis et al. | |
| 2008/0287587 A1 * | 11/2008 | Lin | C08F 2/22 524/445 |
| 2009/0156389 A1 | 6/2009 | Ryoo et al. | |
| 2010/0304953 A1 | 12/2010 | Liu et al. | |
| 2011/0027599 A1 | 2/2011 | Hoek et al. | |
| 2011/0028772 A1 | 2/2011 | Kalyanaraman et al. | |
| 2011/0052466 A1 | 3/2011 | Liu | |

FOREIGN PATENT DOCUMENTS

| | | |
|---|---|---|
| RU | 2004130771 A | 4/2006 |
| RU | 2279159 C1 * | 6/2006 |
| WO | 2009/011890 A2 | 1/2009 |
| WO | 2009/108166 A2 | 9/2009 |
| WO | WO 2009108166 A2 * | 9/2009 ........... B01D 69/148 |
| WO | 2009/142408 A2 | 11/2009 |
| WO | 2010/098473 A1 | 9/2010 |
| WO | 2010/150996 A2 | 12/2010 |
| WO | 2013/006623 A1 | 1/2013 |

OTHER PUBLICATIONS

Brunauer et al., "Adsorption of Gases in Multimolecular Layers," *Journal of the American Chemical Society*, Feb. 1938; 60(2):309-319.
Butt et al., "Compilation of Temperature Factors of Cubic Elements," *Acta Cryst. A.*, Jan. 1, 1988; 44(3):396-399.
Camblor et al., "Synthesis and Structural Characterization of MWW Type Zeolite ITQ-1, the Pure Silica Analog of MCM-22 and SSZ-25," *J. Phys. Chem. B.*, Jan. 1, 1998; 102(1):44-51.
Caro et al., "Zeolite membranes—Recent developments and progress," *Microporous Mesoporous Mat.*, Nov. 1, 2008; 115(3):215-233. Mar. 18, 2008.
Choi et al., "MFI zeolite membranes from a- and randomly oriented monolayers," *Adsorption*, Sep. 2006; 12(5-6):339-360.
Choi et al., "Layer-by-Layer Deposition of Barrier and Permselective c-Oriented-MCM-22/Silica Composite Films," *Ind. Eng. Chem. Res.*, Oct. 24, 2007; 46(22):7096-7106.
Choi et al., "Layered Silicates by Swelling of AMH-3 and Nanocomposite Membranes," *Angew. Chem. Int. Edit.*, Jan. 4, 2008; 47(3):552-555. Available online Nov. 26, 2007.
Choi et al., "Fabrication and gas separation properties of polybenzimidazole (PBI)/nanoporous silicates hybrid membranes," *Journal of Membrane Science*, May 15, 2008; 316(1-2):145-152. Available online Sep. 21, 2007.
Choi et al., "Stable single-unit-cell nanosheets of zeolite MFI as active and long-lived catalysts," *Nature*, Sep. 10, 2009; 461:246-249.
Choi et al., "Grain Boundary Defect Elimination in a Zeolite Membrane by Rapid Thermal Processing," *Science*, Jul. 31, 2009; 325(5940):590-593.
Choi et al., "MCM-22/Silica Selective Flake Nanocomposite Membranes for Hydrogen Separations," *J. Am. Chem. Soc.*, Jan. 20, 2010; 132(2):448-449.
Corma et al., "Delaminated zeolite precursors as selective acidic catalysts," *Nature*, Nov. 26, 1998; 396:353-356.
Corma et al., "Delaminated Zeolites: Combining the Benefits of Zeolites and Mesoporous Materials for Catalytic Uses," *Journal of Catalysis*, Aug. 15, 1999; 186(1):57-63.
Corma et al., "Preparation, characterisation and catalytic activity of ITQ-2, a delaminated zeolite," *Microporous Mesoporous Mater.*, Aug. 1, 2000; 38(2-3):301-309.
Cowley et al., "The scattering of electrons by atoms and crystals. I. A new theoretical approach," *Acta C stallogr.*, Oct. 1957; 10(10):609-619.
Davis, "Ordered porous materials for emerging applications," *Nature*, Jun. 20, 2002; 417; 813-821.
Fang et al. "A "Mix and Match" Ionic—Covalent Strategy for Self-Assembly of Inorganic Multilayer Films," *J. Am. Chem. Soc.*, Dec. 17, 1997; 119(50):12184-12191.
Gao et al., "Nonaqueous Synthesis and Characterization of a New 2-Dimensional Layered Aluminophosphate $[Al_3P_4O_{16}]^{3-} \cdot 3[CH_3CH_2NH_3]^+$," *Journal of Solid State Chemistry*, Feb. 15, 2007; 129(1):37-44.
Giannozzi et al., "Quantum Espresso: a modular and open-source software project for quantum simulations of materials," *J. Phys.: Condes. Matter*, Sep. 1, 2009; 21(39).
Hedlund et al., "A masking technique for high quality MFI membranes," *J. Membr. Sci.*, Sep. 1, 2003; 222(1-2):163-179.
International Search Report and Written Opinion dated Sep. 6, 2012, for International Application No. PCT/US2012/045411, filed Jul. 3, 2012; 6 pages.
International Preliminary Report on Patentability dated Jan. 7, 2014, for International Application No. PCT/US2012/045411, filed Jul. 3, 2012; 7 pages.
Jeong et al., "A highly crystalline layered silicate with three-dimensionally microporous layers," *Nature Materials*, 2003; 2:53-58. Available online Dec. 22, 2002.
Juttu et al., "Characterization and catalytic properties of MCM-56 and MCM-22 zeolites," *Microporous Mesoporous Mater.*, Nov. 2000; 40:9-23.
Kirkland et al., "Simulation of annular dark field stem images using a modified multislice method," *Ultramicroscopy*, 1987; 23(1):77-96.
Kragten et al., "Structure of the Silica Phase Extracted from Silica/(TPA)OH Solutions Containing Nanoparticles," *J. Phys. Chem. B.*, Sep. 18, 2003; 107(37):10006. Available online Aug. 20, 2003.

(56) References Cited

OTHER PUBLICATIONS

Lai et al., "Microstructural Optimization of a Zeolite Membrane for Organic Vapor Separation," *Science*, Apr. 18, 2003; 300(5618):456-460.

Lai et al., "Siliceous ZSM-5 Membranes by Secondary Growth of b-Oriented Seed Layers," *Adv. Funct. Mater.*, Jul. 22, 2004; 14(7):716-729.

LeBaron et al., "Polymer-layered silicate nanocomposites: an overview," *Applied Clay Science*, Sep. 1999; 15(1-2):11-29.

Lee et al., "Sub-40 nm Zeolite Suspensions via Disassembly of Three-Dimensionally Ordered Mesoporous-Imprinted Silicalite-1," *J. Am. Chem. Soc.*, Jan. 26, 2011; 133(3):493. Available online Dec. 16, 2010.

Leonowicz et al., "MCM-22: A Molecular Sieve with Two Independent Multidimensional Channel Systems," *Science*, Jun. 24, 1994; 264(5167):1910-1913.

Lew et al., "Zeolite Thin Films: From Computer Chips to Space Stations," *Accounts Chem., Res.*, Feb. 2010; 43(2):210-219. Available online Oct. 23, 2009.

Li et al., "A New Layered Silicate with Structural Motives of Silicate Zeolites: Synthesis, Crystals Structure, and Properties," *Chem. Mat.*, Mar. 11, 2008; 20(5):1661-2056. Available online Feb. 15, 2008.

Liu et al., "New Crystalline Layered Zinc Phosphate with 10-Membered-Ring Channels Perpendicular to Layers," *Inorganic Chemistry*, Jun. 1, 2009; 48(11):4598-4600. Available online Apr. 20, 2009.

Loane et al., "Thermal vibrations in convergent-beam electron diffraction," *Acta Crystallogr. Sect. A*, May 1991; 47(3):267-278.

Maheshwari et al., "Layer Structure Preservation during Swelling, Pillaring, and Exfoliation of a Zeolite Precursor," *J. Am. Chem. Soc.*, Jan. 30, 2008; 130(4):1507-1516. Available online Jan. 8, 2008.

Maheshwari, "Exfoliated zeolite sheets and block copolymers as building blocks for composite membranes," PhD Dissertation, University of Minnesota; Aug. 2009.

Na et al., "Pillared MFI Zeolite Nanosheets of a Single-Unit-Cell Thickness," *J. Am. Chem. Soc.*, Mar. 31, 2010; 132:4169-4177. Available online Feb. 5, 2010.

Nagahara et al., "Mica etch pits as a height calibration source for atomic force microscopy," *J. Vac. Sci. Technol. B.*, May 1994; 12:1694.

Narkhede et al., "Crystal Structure of MCM-22 (MWW) and Its Delaminated Zeolite ITQ-2 from High-Resolution Powder X-Ray Diffraction Data: An Analysis Using Rietveld Technique and Atomic Pair Distribution Function," *Chem. Mater.*, Sep. 22, 2009; 21:4339-4346. Available online Aug. 26, 2009.

Ogino et al., "Delamination of Layered Zeolite Precursors under Mild Conditions: Synthesis of UCB-1 via Fluoride/Chloride Anion-Promoted Exfoliation," *J. Am. Chem. Soc.*, Mar. 16, 2011; 133(10):3288-3291. Available online Feb. 22, 2011.

Osada et al., "Exfoliated oxide nanosheets: new solution to nanoelectronics," *J. Mater. Chem.*, May 21, 2009; 19:2503-2511. Available online Mar. 18, 2009.

Perdew et al., "Generalized Gradient Approximation Made Simple," *Phys. Rev. Lett.*, Oct. 28, 1996; 77:3865.

Roth et al., "Preparation of exfoliated zeolites from layered precursors: The role of pH and nature of intercalating media," *Studies in Surface Science and Catalysis*, 2002; 141:273-279, Nanoporous Materials III, Proceedings of the $3^{rd}$ International Symposium on Nanoporous Materials, Ottawa, Ontario, Canada, Jun. 12-15, 2002.

Roth et al., "Intercalation chemistry of NU-6(1), the layered precursor to zeolite NSI, leading to the pillared zeolite MCM-39(Si)," *Microporous Mesoporous Mat.*, Oct. 2011; 144(1-3):158-161.

Rubio et al., "Exfoliated Titanosilicate Material UZAR-S1 Obtained from JDF-L1," *Eur. J. Inorg. Chem.*, Jan. 2010; 2010(1):159-163. Available online Nov. 20, 2009.

Ryoo et al., "Zeolite catalysts: Thinly Sliced,"*NPG Asia Materials*, 2009. Available online Oct. 29, 2009.

Sakamoto et al., ["Structural Characterization of Nanosheet-type MFI Zeolite,"] *J. Cryst. Soc. Jpn.*, 2010; 53(2):135-140.

Schlenker et al., "Computed X-ray Powder Diffraction Patterns for Ultrasmall Zeolite Crystals," *J. Appl. Crystallogr.*, Apr. 1, 1996; 29:178-185.

Snyder et al., "Hierarchical Nanomanufacturing: From Shaped Zeolite Nanoparticles to High-Performance Separation Membranes," *Angew. Chem. Int. Edit.*, Oct. 8, 2007; 46(40):7560-7573. Available online Aug. 13, 2007.

Srivastava et al., "Composite Layer-by-Layer (LBL) Assembly with Inorganic Nanoparticles and Nanowires," *Accounts Chem. Res.*, Dec. 16, 2008; 41(12):1831-1841. Available online Nov. 18, 2008.

Takabashi et al., "Exfoliation of Layered Silicates through Immobilization of Imidazolium Groups," *Chem. Mat.*, Jan. 25, 2011; 23(2):266-273. Available online Dec. 21, 2010.

Tsapatsis et al., "A New, Yet Familiar, Lamellar Zeolite," *ChemCatChem*, Mar. 8, 2010; 2(3):246-248.

UDSKIP Algorithm, Nano Porous Carbon Research Initiative at the University of Delaware, copyright 2002; Retrieved from the Internet: http://www.che.udel.edu/research_groups/nanomodeling/resources.html; 2 pages.

van Koningsveld et al., "The monoclinic framework structure of zeolite H-ZSM-5. Comparison with the orthorhombic framework of as-synthesized ZSM-5," *Zeolites*, Apr.-May 1990; 10(4):235242.

Varoon et al., "Dispersible Exfoliated Zeolite Nanosheets and Their Application as a Selective Membrane," *Science*, Article and Supporting Online Material, Oct. 7, 2011; 334(6052):72-75.

Wang et al., "Crystal Structure of the New Layer Silicate RUB-39 and Its Topotactic Condensation to a Microporous Zeolite with Framework Type RRO," *Chem. Mat.*, Aug. 21, 2007; 19(6):4181-4188. Available online Jul. 21, 2007.

Wu et al., "Delamination of Ti-MWW and High Efficiency in Epoxidation of Alkenes with Various Molecular Sizes," *J. Phys. Chem. B.*, Dec. 16, 2004; 108(50):19126-19131. Available online Nov. 16, 2004.

Yu et al., "Rich Structure Chemistry in the Aluminophosphate Family," *Accounts Chem. Res.*, Jul. 2003; 36(7):481-490. Available online Mar. 27, 2003.

Yuan et al., "Dual Function of Racemic Isopropanolamine as Solvent and as Template for the Synthesis of a New Layered Aluminophosphate: $[NH_3CH_2CH(OH)CH_3]_3 \cdot_{A/3}P_4O_{16}$," *Journal of Solid State Chemistry*, Apr. 2000; 151(1):145-149.

\* cited by examiner

ZEOLITE NANOSHEET MEMBRANE

This application is the U.S. National Stage of International Application No. PCT/US2012/045411, filed on Jul. 3, 2012, entitled ZEOLITE NANOSHEET MEMBRANE, which claims the benefit of U.S. Provisional Application No. 61/504,214, filed Jul. 3, 2011, each of which is incorporated herein by reference in its entirety.

GOVERNMENT FUNDING

This invention was made with government support under DE-FE0001322 and DE-SC0001004 awarded by the U.S. Department of Energy and CMMI-0707610 awarded by the National Science Foundation. The government has certain rights in the invention.

BACKGROUND

Interest in porous lamellar solids, i.e., layered zeolite and related materials, has dramatically increased recently due to the discovery of new layered materials and new routes to modify existing lamellar zeolites. Materials with nanoporous layers have structures which are intermediate between crystalline nanoporous frameworks (e.g., zeolites) and typical layered materials (e.g., clay minerals). Each nanoporous layer includes a porous network while the gallery between layers allows for intercalation, pillaring and exfoliation. Layered zeolite materials and methods of making them have been disclosed in International Application Publication No. WO 2009/108166 A2).

New porous lamellar solids and convenient methods of preparing them are needed as materials for applications for a variety of areas including, for example, catalysis, membrane based separations, and improving mechanical properties of polymers.

SUMMARY

Oxide materials, thin films, coatings, and methods of preparing the same are disclosed herein. In one aspect, the present disclosure provides exfoliated layered oxide materials having an MFI type framework.

In one embodiment, the oxide material comprises an exfoliated silicalite-1. The exfoliated material can optionally include a polymer having a glass transition temperature below about 150° C. Useful polymers include, but are not limited to, polystyrene, polypropylene, a polyolefin, a polymethacrylate, polyvinylalcohol, a polyacrylamide, a polycaprolactone, a copolymer of ethylene, a copolymer of propylene, a copolymer of acetate, poly(ethylene terephthalate), a nylon, a polysulfone, a polyimide, a polyamidimide, a polybenzaimidazole, and combinations thereof.

In another embodiment, the exfoliated oxide material has an X-ray diffraction (XRD) pattern substantially as illustrated in FIG. 2(B). Additional peaks may be revealed upon better resolution of the XRD pattern. In certain embodiments, the exfoliated oxide material can have an MFI type framework (referred to herein as MIN-4). In certain embodiments, the oxide material can have layers of 3.2±0.3 nm thickness. In certain embodiments, the exfoliated oxide material can have a width (i.e., a basal plane linear dimension) of 50 nm to 500 nm.

In another aspect, the present disclosure provides a method of making a film of an oxide material. In certain embodiments, the oxide material can have an MWW type framework or an MFI type framework. Films of oxide materials made by such methods are also provided.

In one embodiment, the method includes: providing a suspension of an exfoliated layered oxide material in a solvent; and filtering the suspension through a porous support to provide a film of the oxide material, optionally directly on the porous support. Useful solvents include, for example, organic solvents such as toluene. Optionally, the method can further include calcining the oxide material at a temperature of 400° C. to 700° C. for 1 hour to 48 hours. In certain embodiments, at least a portion of the exfoliated oxide layers (and in certain embodiments substantially all of the exfoliated oxide layers) in the film are arranged with their thin dimension substantially perpendicular to the porous support.

In certain embodiments, the suspension of the exfoliated layered oxide material can be prepared from a composite that includes the layered oxide material and a polymer, wherein the layers of the oxide material are exfoliated by the polymer. For example, the composite can be contacted with a solvent under conditions effective to dissolve the polymer (e.g., at a temperature of no greater than 200° C., no greater than 100° C., or about room temperature) and provide the suspension of the nanosheets of the oxide material in the solvent. Optionally, conditions can further include sonicating the nanosheets of the oxide material in the solvent to disperse the nanosheets in the solvent.

In certain embodiments, the composite can be prepared by melt blending and/or solvent casting a swollen layered oxide material with the polymer. Useful polymers include, but are not limited to, polystyrene, polypropylene, a polyolefin, a polymethacrylate, polyvinylalcohol, a polyacrylamide, a polycaprolactone, a copolymer of ethylene, a copolymer of propylene, a copolymer of acetate, polyethylene terephthalate), a nylon, a polysulfone, a polyimide, a polyamidimide, a polybenzaimidazole, and combinations thereof.

In another aspect, the present disclosure provides a method of preparing a secondary grown film of an oxide material. In certain embodiments, the method includes: providing a film of an oxide material prepared as described herein; and contacting the film with a material including a silica sol and/or a silica gel under conditions effective for secondary growth to occur. Exemplary conditions include hydrothermal conditions including, for example, treatment in an autoclave at a temperature of 50° C. to 200° C. for a time of 1 hour to 48 hours. Optionally, the oxide material can be calcined at a temperature of, for example, 400° C. to 700° C. for 1 hour to 48 hours. Secondary grown films of the oxide material prepared by such methods are also provided.

Thin zeolite films are attractive for a wide range of applications including molecular sieve membranes and catalytic membrane reactors, permeation barriers, low dielectric constant materials for microelectronics and sensor components for selective sensing. Synthesis of thin zeolite films using high aspect ratio zeolite nanosheets is desirable due to the packing and processing advantages of the nanosheets over isotropic zeolite nanoparticles. However, attempts to obtain a dispersed suspension of crystalline zeolite nanosheets via exfoliation of their lamellar precursors have been hampered due to structure deterioration and morphological damages (fragmentation, bending, curling and aggregation) of the nanosheets. Here we demonstrate the synthesis and structure determination of highly crystalline nanosheets of two well known zeolite frameworks (MWW and MFI). The unprecedented purity and uniformity of these nanosheets allow them to pack well even on a porous support with large surface roughness, facilitating the fabrication of an organic vapor separation membrane by a simple filtration process followed by a single hydrotheuual treatment, making the process attractive for large scale production.

DEFINITIONS

The term "comprises" and variations thereof do not have a limiting meaning where these terms appear in the description and claims.

As used herein, "a," "an," "the," "at least one," and "one or more" are used interchangeably.

As used herein, the term "or" is generally employed in the sense as including "and/or" unless the context of the usage clearly indicates otherwise.

Also herein, the recitations of numerical ranges by endpoints include all numbers subsumed within that range (e.g., 1 to 5 includes 1, 1.5, 2, 2.75, 3, 3.80, 4, 5, etc.).

As used herein, the term "MCM-22(P)" or "zeolite MCM-22(P)" (i.e., a precursor of MCM-22 defined below) refers to a layered material comprised of 2.5 nm thick sheets stacked in registry. Each sheet consists of a bidimensional 10-member ring (MR) sinusoidal channel pore system and large 12-MR cups on the crystal surface. These large cups are connected to each other through double 6-MR.

As used herein, the term "ITQ-1" refers to a layered zeolite having an MWW type framework.

As used herein, the term "Layered Silicalite-1" refers to layered zeolite having an MFI type framework and consists of $SiO_2$.

As used herein, the term "Layered MFI" refers to layered zeolite having an MFI type framework.

As used herein, the term "swelling" without any further qualification refers to increasing the thickness of the gallery by introducing an ionic or non-ionic surfactant or one or more other guest molecules into the gallery space.

As used herein, the term "intercalating" refers to a type of swelling which involves the introduction of an ionic or non-ionic surfactant or one or more other guest molecules into the gallery (space between the layers) of a host structure without any major structural changes in any layer of the host structure. The resulting product is an intercalated phase. Structural changes which occur include increased gallery spacing (i.e., thickness) and only minor changes of the layer structure. Minor changes include, for example, a change in bond angles and atomic positions with minimal or no corresponding change in atom connectivity.

As used herein, the term "exfoliation" without any further qualification refers to separating the layers of a layered material to an extent such that layers lose correlation or registry with each other.

As used herein, the term "repeatedly washing" refers to a process of dispersing a product in a suitable amount of freshly distilled water, separating the product from water by centrifugation, removing the water from the centrifuge, and then repeating the entire process again until the desired result is achieved.

As used herein, the term "film" refers to a thin film having a thickness of less than about 10 micron, and in certain embodiments less than about 1 micron.

As used herein, the term "membrane" refers to a film capable of performing separations.

As used herein, the term "zeolite" refers to a crystalline macroporous oxide material.

The above summary is not intended to describe each disclosed embodiment or every implementation of the present invention. The description that follows more particularly exemplifies illustrative embodiments. In several places throughout the application, guidance is provided through lists of examples, which examples can be used in various combinations. In each instance, the recited list serves only as a representative group and should not be interpreted as an exclusive list.

DETAILED DESCRIPTION OF ILLUSTRATIVE EMBODIMENTS

High aspect ratio zeolite single crystals with thickness in the nanometer range (zeolite nanosheets), are desirable for applications including building blocks for heterogeneous catalysts and the fabrication of thin molecular sieve films and nanocomposites for energy efficient separations. They could also be of fundamental importance as they would allow probing mechanical, electronic, transport and catalytic properties of microporous networks at the nanoscale. Despite the steady advances in the preparation and characterization of layered materials containing microporous layers and of their pillared and swollen analogues, the synthesis of suspensions containing discrete, intact, non-aggregated zeolite nanosheets has proven elusive due to structural deterioration and/or aggregation of the lamellae upon exfoliation. Here, we report the isolation and structure determination of highly crystalline zeolite nanosheets of the MWW and MFI structure type and demonstrate the use of their suspensions in the fabrication of zeolite membranes.

Figure 5:
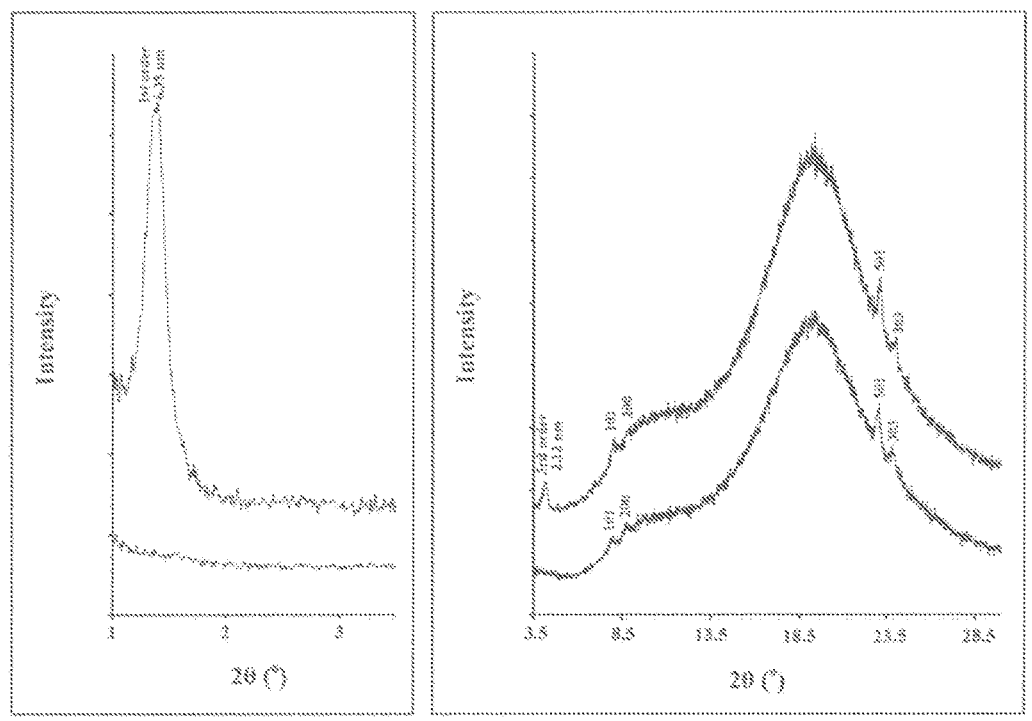
FIG. 5 illustrates XRD patterns at small (left) and wide (right) angles from a polystyrene/layered MFI nanocomposite before (upper trace) and after (lower trace) melt blending. The 1st and the 3rd order reflections of the layered structure disappear after melt blending indicating exfoliation, while the higher angle peaks remain unchanged indicating structure preservation during exfoliation. The absence of the 2nd order reflection of the layered structure has been addressed before in by Na et al., *J. Am. Chem. Soc.* 132, 4169 (2010)). The broad underlying peaks are due to polystyrene.
Figure 6:
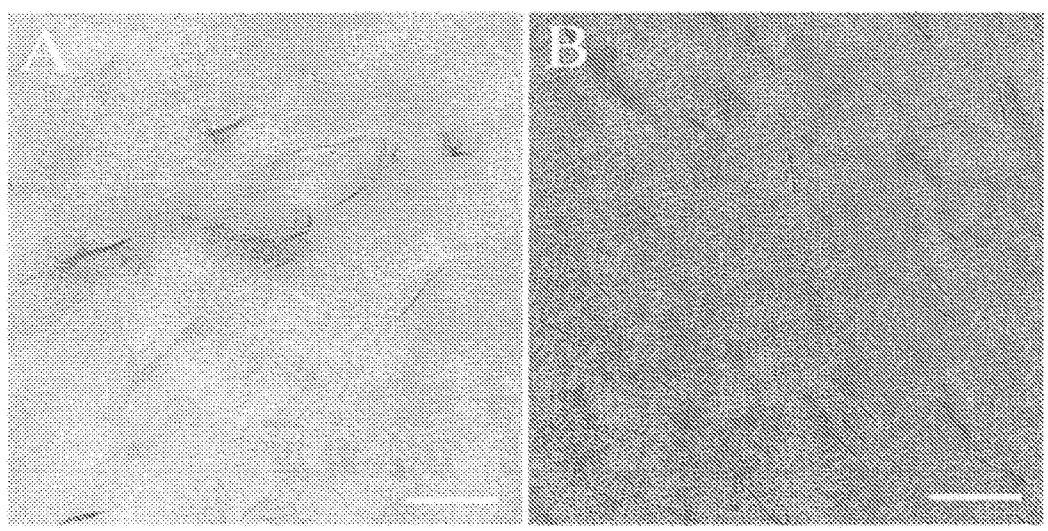
FIG. 6 illustrates TEM images of thinly sectioned (microtomed) nanosheet-polystyrene nanocomposites prepared by melt compounding. (A) MWW-nanosheets and (B) MFI-nanosheets in polystyrene matrix. The scale bars indicate 200 nm.

MWW- and MFI-nanosheets were prepared starting from their corresponding layered precursors ITQ-1 (Leonowicz et al., Science 264, 1910 (1994)) and multilamellar silicalite-1 (Choi et al., Nature 461, 246 (2009)), respectively. Prior to exfoliation by melt blending with polystyrene (weight-average molecular weight=45000 g/mol), ITQ-1 was swollen following a previously reported procedure (Maheshwari et al., J Am. Chem. Soc. 130, 1507 (2008)), while multilamellar silicalite-1 was used as-made. Melt blending was performed under nitrogen environment in a co-rotating twin screw extruder with a recirculation channel (DACA mini compounder) at a screw speed of 300 revolutions per minute (rpm) and using a certain temperature-time sequence (120° C. for 20 minutes, 170° C. for 25 minutes, 150° C. for 30 minutes, 200° C. for 20 minutes, and finally extruded out at 150° C.) (Maheshwari, PhD Dissertation, Exfoliated zeolite sheets and block copolymers as building blocks for composite membranes, University of Minnesota (2009)). Microtomed sections of the polystyrene nanocomposites obtained by melt blending were characterized by transmission electron microscopy (TEM) to reveal the presence of exfoliated MWW- and MFI-nanosheets embedded in the polymer matrix (FIGS. 5 and 6).

Figure 1:
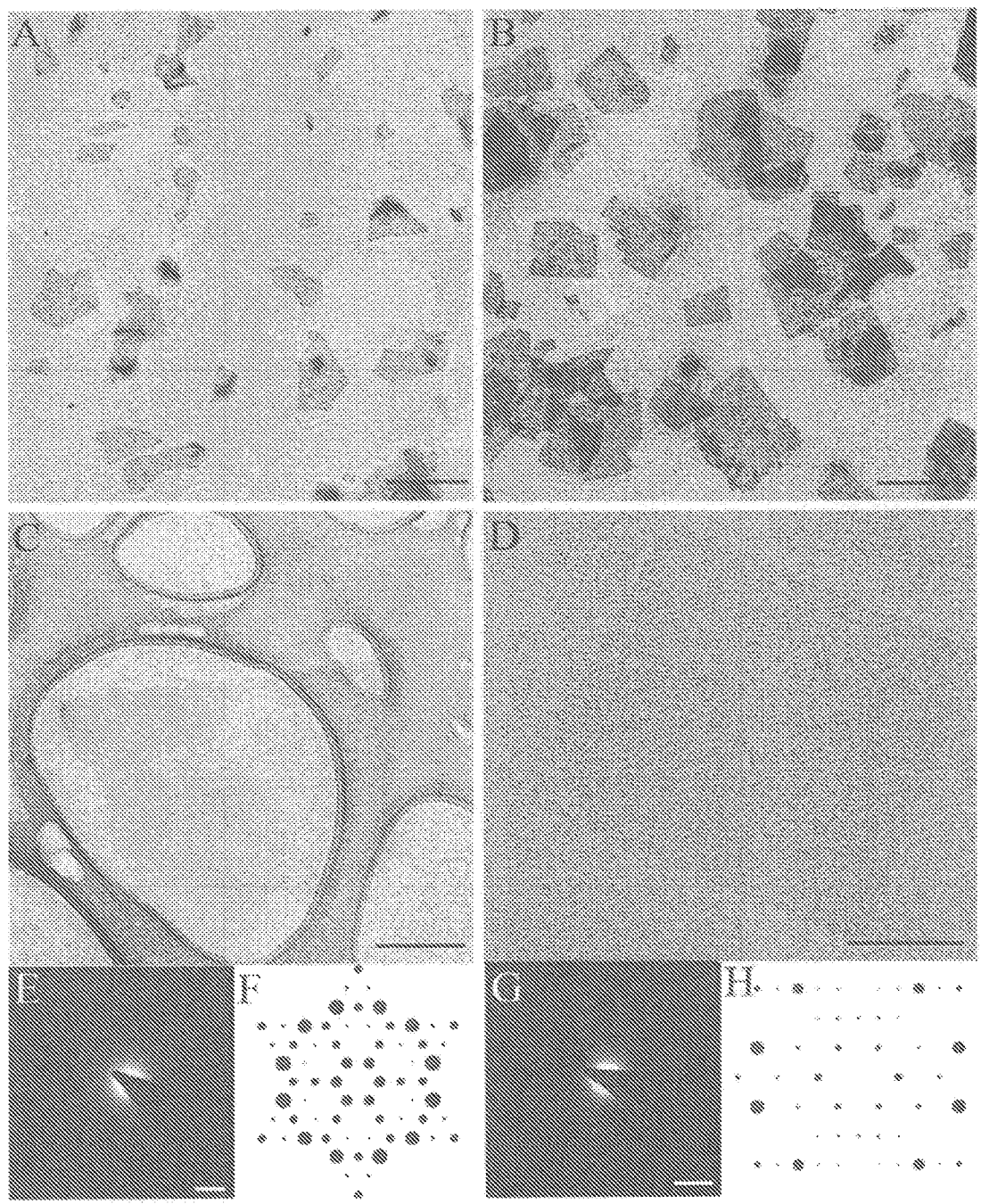
FIG. 1 illustrates low-magnification TEM images of c-oriented MWW- (A) and b-oriented MFI-nanosheets (B). TEM images of single MWW- and MFI-nanosheets are shown in (C) and (I)), respectively. (E) and (G) are the corresponding ED patterns of the same particles shown in (C) and (D), respectively. Simulation of the ED patterns of proposed structures of nanosheets along [0001] zone axis (MWW) and [010] zone axis (MFI) are shown in (F) and (II), respectively, where spot areas are proportional to the corresponding intensities. Scale bars indicate 200 nm for (A), (B) and (C), 50 nm for (D) and 1 $nm^{-1}$ for (E) and (G).
Figure 7:
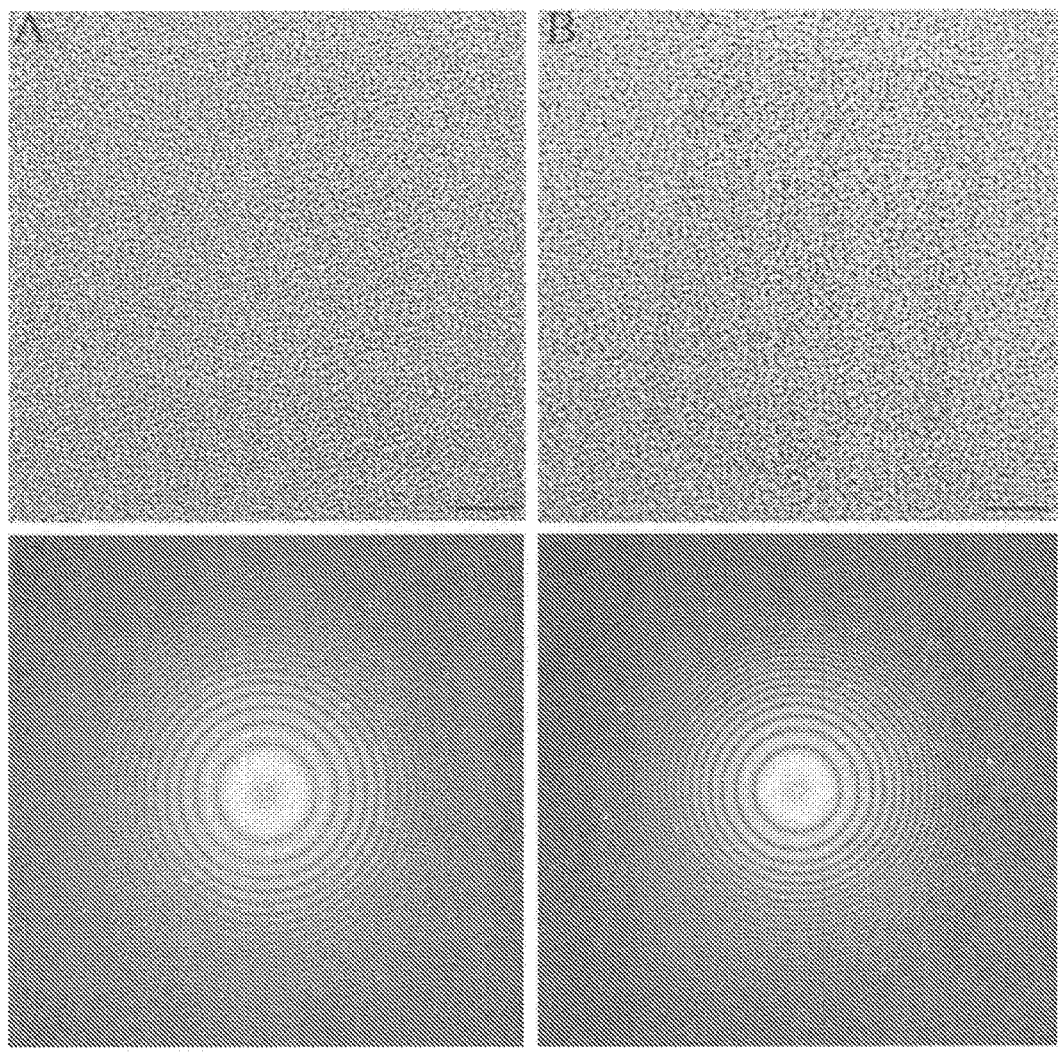
FIG. 7 illustrates HRTEM images of nanosheets and corresponding fast Fourier transform (FFT). (A) HRTEM image of an MWW-nanosheet. (B) HRTEM image of an MFI-nanosheet. (C) FFT of A. (D) FFT of B. The scale bars in (A) and (B) indicate 200 nm.

To obtain a dispersion of these nanosheets, the nanosheet-polystyrene nanocomposites were placed in toluene and sonicated. After polymer dissolution and removal of larger particles by centrifugation (12000 relative centrifugal force (RCF) for 10 minutes), the dispersions, containing approximately 1.25% w/w polymer and 0.01% w/w nanosheets, were used to prepare samples for TEM and atomic force microscopy (AFM) examination by drying a droplet on TEM grids and freshly cleaved mica surfaces, respectively (AFM sample calcined at 540° C. to remove polymer). Low magnification TEM images of high aspect ratio MWW- and MFI-nanosheets reveal their flake-like morphology (FIGS. 1, A and B). The uniform contrast from isolated nanosheets suggests uniform thickness, while the darker areas can be attributed to overlapping of neighboring nanosheets. Although lattice fringes are not easily visible in the high resolution TEM (HRTEM) images of the nanosheets (FIGS. 7, A and B), they do exist, as confirmed by their fast Fourier transform (FFT) (FIGS. 7, C and D). In addition, electron diffraction (ED) from a single MWW- and MFI-nanosheet (FIGS. 1, C to E and G) and X-ray diffraction (XRD) data obtained from calcined powders of MWW- and MFI-nanosheets (FIGS. 2, A and B) confirm that the nanosheets are highly crystalline materials of the MWW and MFI type, respectively. The thin dimensions of MWW- and MFI-nanosheets, as expected, are along the c- and b-axes, respectively, as indicated from the FFT (of the HRTEM images) and the ED data.

Figure 2:
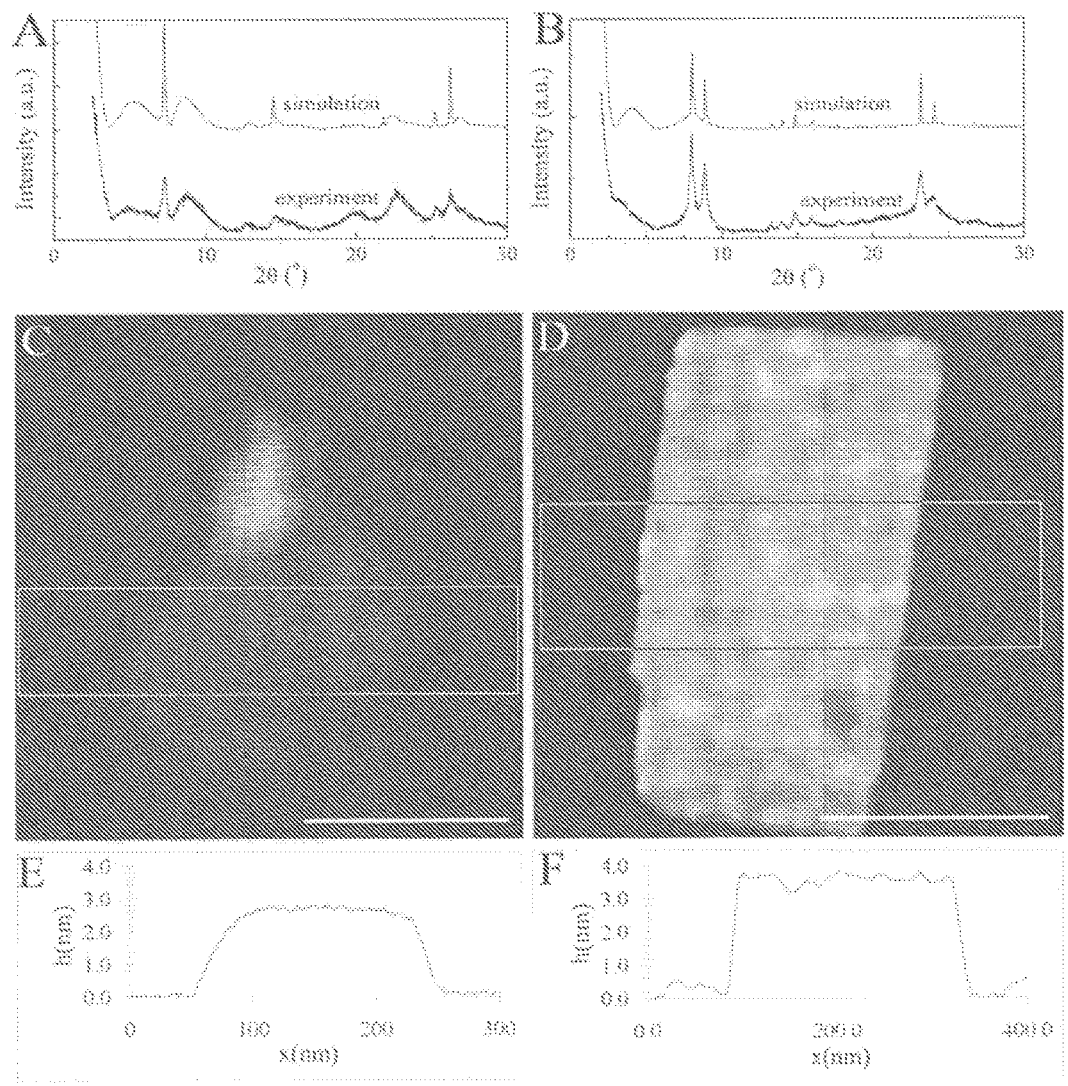
FIG. 2 illustrates powder XRD patterns from MWW-nanosheets (A) and MFI-nanosheets (B). The bottom traces show experimental XRD patterns (Cu Kα source, λ=1.5418 Å) of the powder obtained by calcination of the nanosheet-polystyrene nanocomposite at 540° C. The top traces are the simulated XRD patterns (powder pattern theorem, implemented with UDSKIP) of the proposed structure of the nanosheets. AFM (tapping mode) topographical images of MWW- and MFI-nanosheets are shown in (C) and (I)), respectively. Average step height data of the area highlighted in (C) and (I)) is plotted in (E) (MWW-nanosheet) and (F) (MFI-nanosheet). The height data is calibrated using steps formed on freshly cleaved mica (FIG. 7). The scale bars in (C) and (I)) indicate 200 nm.
Figure 3:
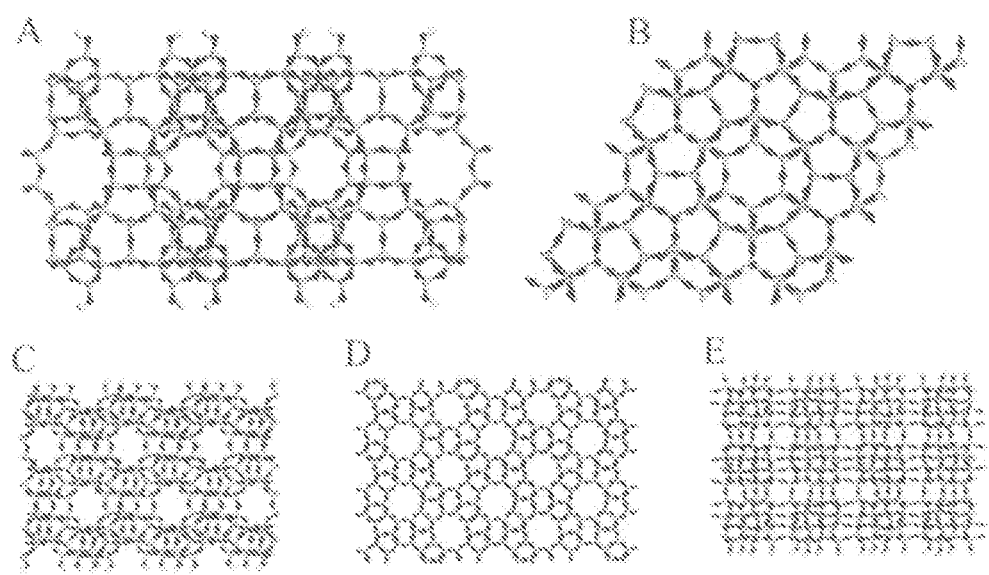
FIG. 3 illustrates relaxed surface structures of the MWW- and MFI nanosheets obtained by structure optimization of the 1 unit cell thick MWW and 1.5 unit cell thick MFI structures with Car-Parrinello molecular dynamics. Si, O, and H atoms are shown as light gray, dark gray, and white, respectively. (A and B) MWW-nanosheets viewed along a- (or b-) axis (A) and along c-axis (B). (C to E) MFI-nanosheets viewed along a-axis (C), b-axis (top-view) (D) and c-axis (E).
Figure 8:
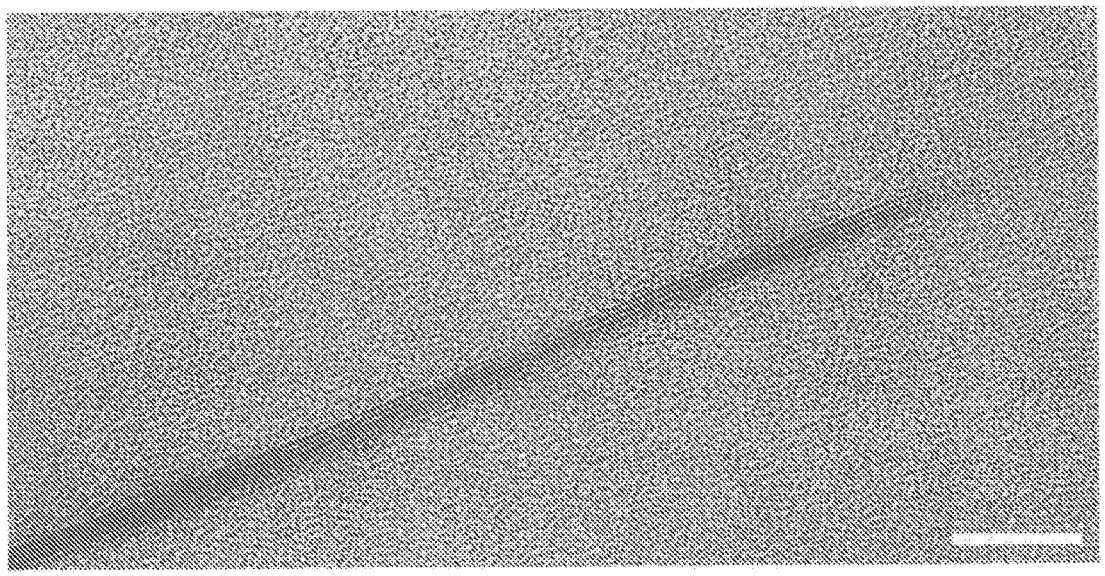
FIG. 8 illustrates HRTEM image of a thinly sectioned MFI nanosheet-polystyrene nanocomposite prepared by melt compounding. The three dark lines running along the nanosheet correspond to the three pentasil chains.
Figure 9:
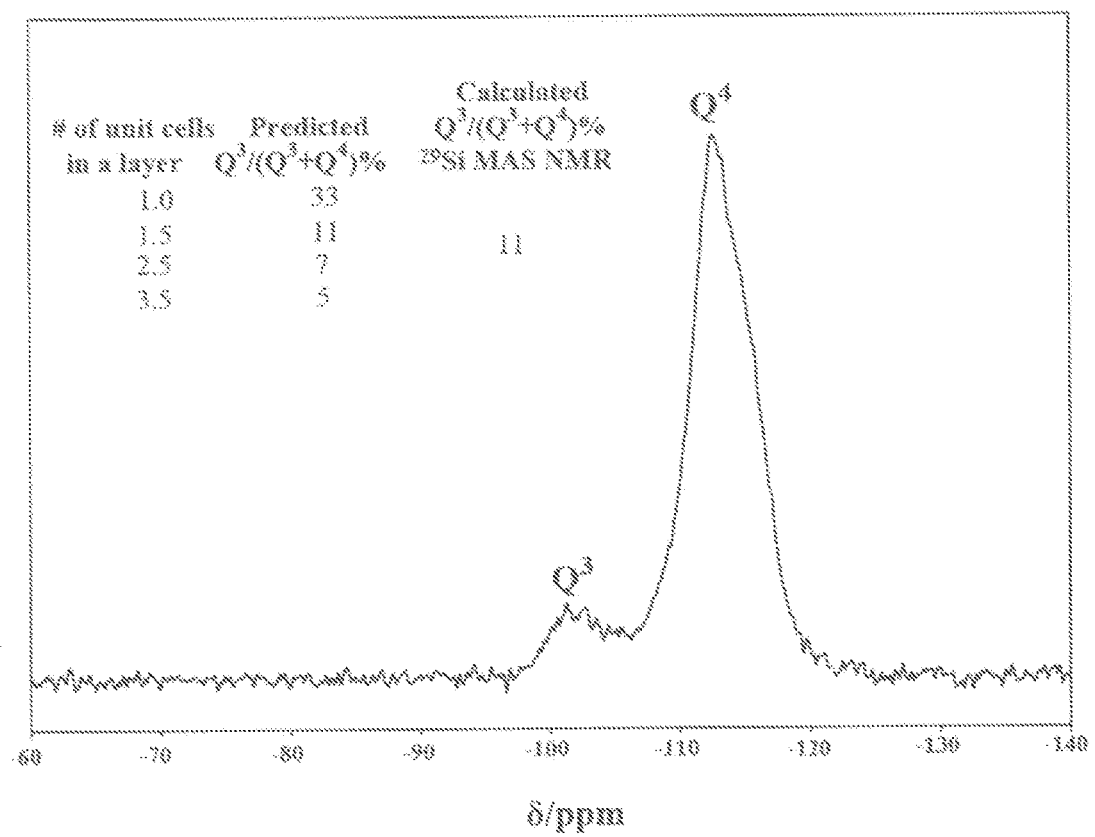
FIG. 9 illustrates $^{29}Si$ MAS NMR of exfoliated MFI. The $Q^3/(Q^3+Q^4)$ ratios for MFI layer structure with its thickness in the range of 1-2.5 unit cell is listed in the inset. The calculated $Q^3/(Q^3+Q^4)$ ratio from $^{29}Si$ MAS NMR indicates that the exfoliated MFI layers are 1.5 unit cell thick.

Atomic force microscopy (AFM) measurements, calibrated using steps formed on freshly cleaved mica (Nagahara et al., J. Vac. Sci. Technol. B 12, 1694 (1994)), revealed remarkable uniformity in nanosheet thickness obtained by this procedure: 2.6±0.3 and 3.4±0.3 nm for the MWW- and MFI-nanosheets, respectively (FIG. 2, C to F). The MWW-nanosheet thickness is close to the one expected from the thickness of the ITQ-1 layers (Corma et al., Nature 396, 353 (1998); and Corma et al., Microporous Mesoporous Mater. 38, 301 (2000)). FIGS. 3, A and B show side and top views of the proposed MWW-nanosheet structure that is consistent with the AFM measurements and MWW layer structure. The MFI-nanosheet thickness, determined by AFM is consistent with 1.5 unit cells along the b-axis. Further examination of the TEM images collected here (FIG. 8) and of the images given in Choi et al., Nature 461, 246 (2009), in conjunction with the thickness determined by the AFM suggests the presence of three complete pentasil chains running along the nanosheets. The proposed structure of MFI-nanosheets based on these data is shown in FIGS. 3, C and E (side views) and D (top view). A $Q^3/(Q^3+Q^4)$ ratio of 11% is calculated from this model, which is in agreement with the $^{29}$Si magic angle spinning nuclear magnetic resonance data (FIG. 9).

Figure 10:
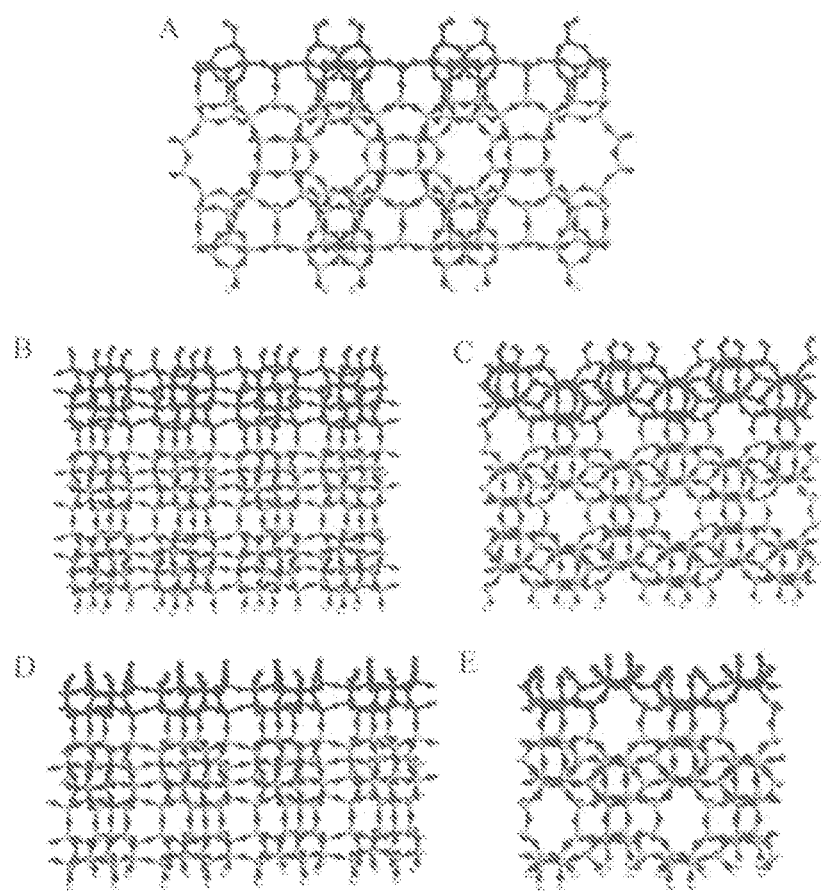
FIG. 10 illustrates side-views of relaxed structures of the MWW- and MFI-nanosheets obtained by structure optimization of nanosheets with Car-Parrinello molecular dynamics. (A) 1 unit cell thick MWW-nanosheet with relaxed surface structure viewed along a-axis; 1.5 unit cell thick silicalite-1 nanosheet with relaxed surface structure, viewed along c-axis (B), and a-axis (C); 1 unit cell thick silicalite-1 nanosheet with relaxed surface structure, viewed along c-axis (D), and a-axis (E). The cluster of atoms that were allowed to relax is shown in black. The rest of the Si, 0, and H atoms are shown as light gray, dark gray, and white, respectively.
Figure 11:
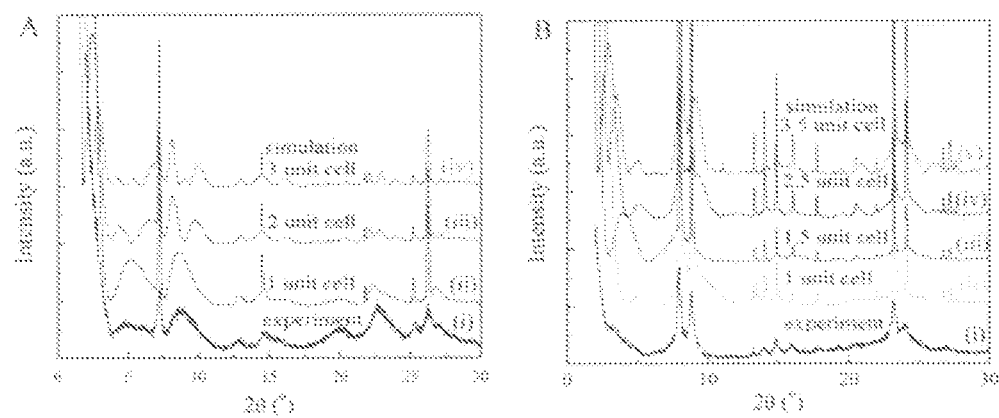
FIG. 11 illustrates a comparison between experimental and simulated powder X-ray diffraction patterns of the nanosheets, where bottom trace is the experimental pattern, and top traces are simulated patterns. (A) Comparison for the MWW-nanosheet; trace (i) is the experimental powder XRD pattern, and traces (ii), (iii) and (iv) are the simulated patterns for 1, 2 and 3 unit cell thick MWW-nanosheets, respectively. The comparison indicates that the simulated pattern of 1 unit cell thick nanosheets agrees with the experimental pattern. (B) Comparison for the MFI-nanosheets; trace (i) is the experimental powder XRD pattern, and traces (ii), (iii), (iv) and (v) are the simulated patterns for 1, 1.5, 2.5 and 3.5 unit cell thick MFI-nanosheets, respectively. The comparison indicates that the simulated pattern of 1.5 unit cell thick nanosheets agrees with the experimental pattern. Both (A) and (B) indicate that the peaks at low angles are sensitive to nanosheet thickness.

The proposed structures of the MWW- and MFI-nanosheets are consistent with all of TEM, ED and AFM data and the structure of their precursors (FIG. 3). Optimization of nanosheet structures using damped-dynamics simulation by the Car-Parrinello molecular dynamics (CPMD) code in the Quantum ESPRESSO package (Giannozzi et al., J Phys.: Condes. Matter 21, (2009); and as further discussed herein) led to minor changes (FIG. 10) when compared to those obtained by simple termination of the MWW and MFI structures. More specifically, the calculated MWW- and MFI-nanosheet thickness are slightly different as compared to the ones obtained from the MWW and MFI frameworks (2.63 nm vs. 2.49 nm and 3.20 nm vs. 3.21 nm, respectively) and both are in agreement with the AFM measurements. The corresponding ED and XRD patterns from their optimized structures were simulated as further discussed herein and compared to the experimental data. The ED pattern simulations (FIGS. 1, F and H) performed using the Multislice method (Cowley et al., Acta Crystallogr. 10, 609 (1957); Kirkland et al., Ultramicroscopy 23, 77 (1987); and Loane et al., Acta Crystallogr. Sect. A 47, 267 (1991)), are in agreement with the experimental ED patterns (FIGS. 1, E and G). Moreover, XRD simulations using powder pattern theorem, implemented with UDSKIP (Schlenker et al., J Appl. Crystallogr. 29, 178 (1996); UDSKIP algorithm to calculate theoretical Powder X-Ray diffraction patterns of ultra-small zeolite crystals on the world wide web at che.udel.edu/research_groups/nano-modeling/resources.html; and Kragten et al., J. Phys. Chem. B 107, 10006 (2003)) are also in a good agreement with the experimental XRD data (FIGS. 2, A and B). The positions of the broad peaks at low angles are very sensitive to the layer thickness and confirm the thickness suggested by AFM. More specifically, simulations using MFI-nanosheet thickness of 1, 1.5, 2.5 and 3.5 unit cells (FIG. 11) showed that the best agreement with the experimental data is obtained for 1.5 unit cell thickness, while the MWW simulations indicated 1 unit cell thickness. The position of the sharper peaks at higher angles is insensitive to the layer thickness. They indicate long-range order preservation upon exfoliation. It is worth noting that the XRD of MFI-nanosheets shows sharper reflections compared to that of MWW-nanosheets, probably due to the differences in thicknesses and better structural preservation of MFI-nanosheets. The later could be attributed to the absence of the swelling step in their processing.

Figure 12:
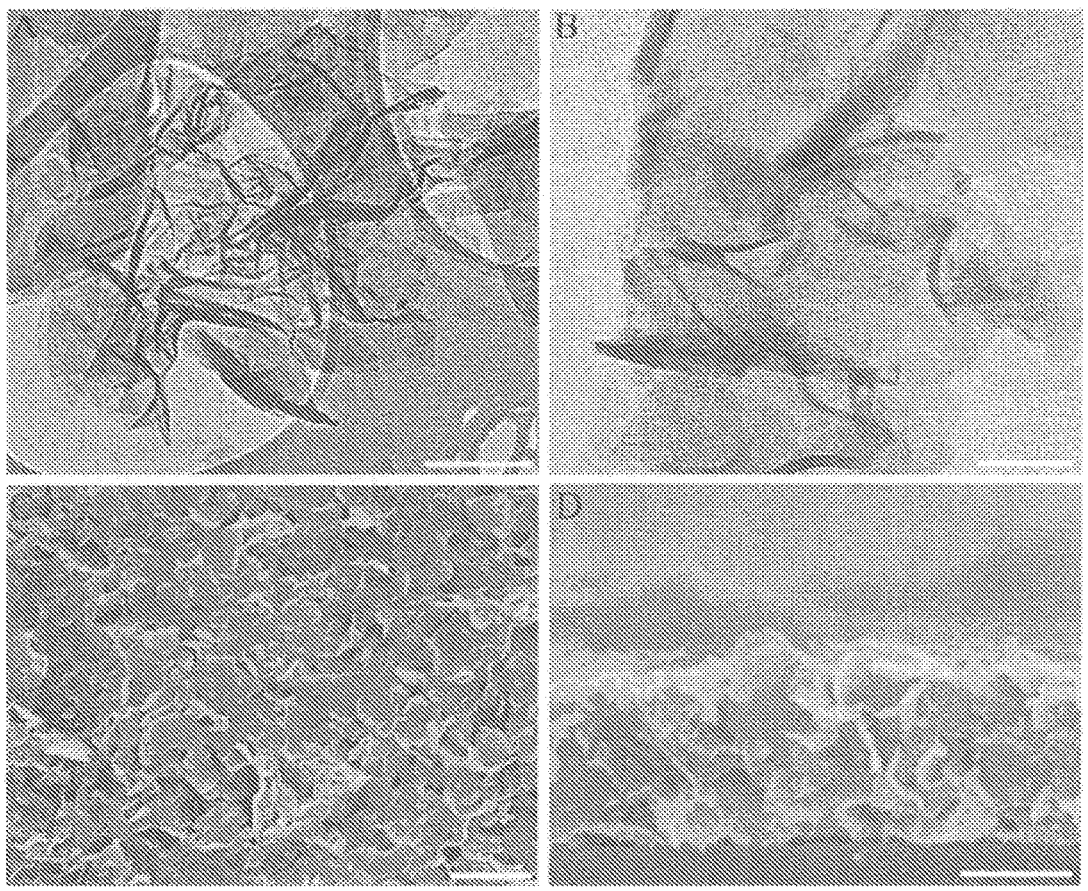
FIG. 12 illustrates TEM images of agglomerated and curled MWW-nanosheets (A) and MFI-nanosheets (B) obtained after calcination of the polymer nanocomposite at 540° C. SEM images (top-(C) and side-views (D)) of MWW-nanosheet coating formed from an aqueous dispersion of nanosheets obtained after calcination of the polymer nanocomposite at 540° C. The nanosheet orientation in the coated film is not uniform due to their curling and bending. The scale bars indicate 200 nm for (A), 50 nm for (B) and 1 micron for (C) and (D).

Previous attempts to obtain exfoliated nanosheets of MWW have had only partial success because of the fragmentation, aggregation, and curling of the lamellae (Juttu et al., Microporous Mesoporous Mater. 40, 9 (2000); Maheshwari, PhD Dissertation, Exfoliated zeolite sheets and block copolymers as building blocks for composite membranes, University of Minnesota (2009); and Wu et al., J. Phys. Chem. B 108, 19126 (2004)), whereas exfoliation of lamellar silicalite-1 has not been reported before. Our attempts to remove the polystyrene by methods that include calcination or other thermal treatments of the nanosheetpolymer nanocomposite resulted in particles that exhibited significant curling (FIGS. 12, A and B). The presence of curled particles is detrimental to the quality of coatings, because the curled particles neither pack nor orient themselves in their coatings (FIGS. 12, C and D). However, the dissolution and purification process reported here was sufficient to obtain flat, crystalline, exfoliated nanosheets capable of producing a highly packed and oriented coating.

Figure 4:
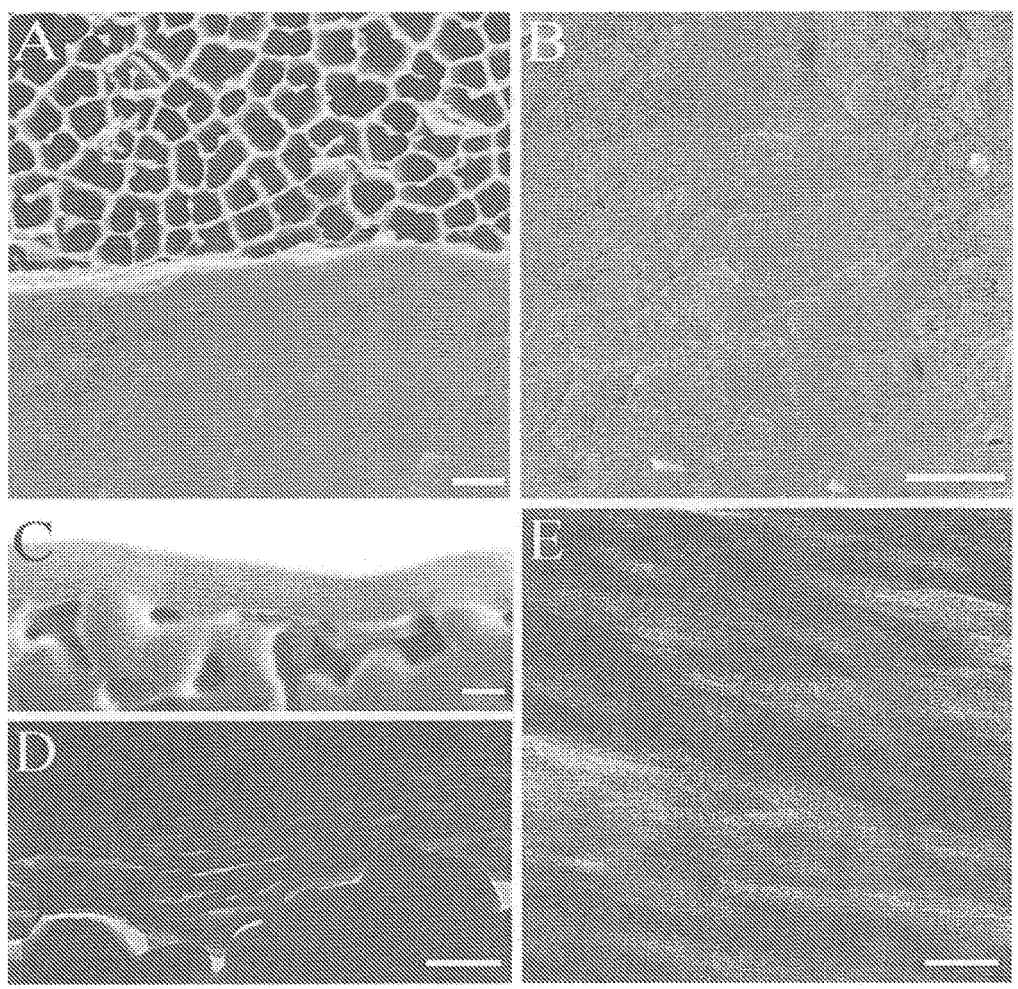
FIG. 4 illustrates images of the MFI-nanosheet coating on porous supports. (A) SEM image (top-view) of the coating of MFI-nanosheets on an Anopore disk. The top half of the image shows the bare Anopore support, while the bottom half shows a uniform coating of nanosheet on the 200 nm pores of the support. (B) SEM image (top-view) of the coating of MFI-nanosheet on a homemade porous α-alumina support. (C) FIB image of the cross section of the coating in (B). The image is taken by a Ga ion source (30 KV) at a tilt angle of 52°. The nanosheet coating is sandwiched between the FIB deposited platinum (to protect the coating from milling) and the alumina support. (D) TEM image of the cross section of the coating in (B). The dark layer on top of the coating is FIB deposited platinum. (E) HRTEM image of the coating cross section. The scale bars indicate 200 nm in (A) to (D) and 20 nm in (E).
Figure 13:
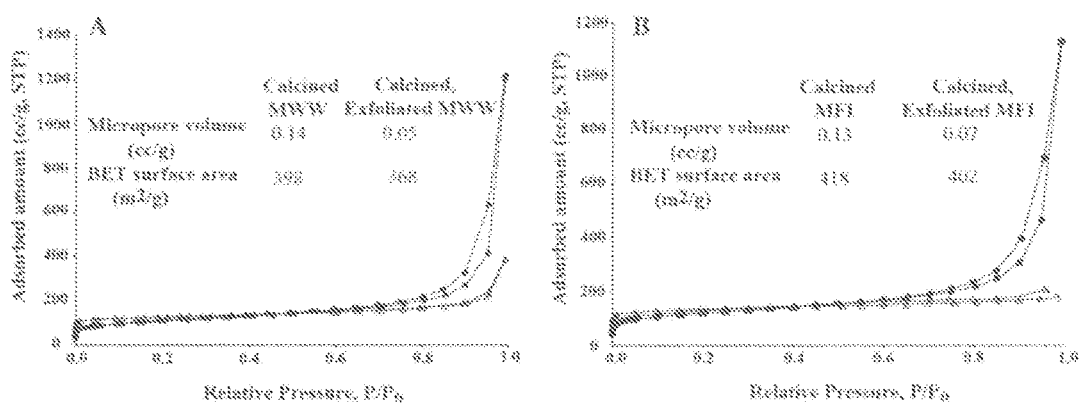
FIG. 13 illustrates $N_2$ adsorption-desorption isotherm of (A): calcined MWW (triangles) and calcined, exfoliated MWW (circles), and (B): calcined commercial MFI (triangles) and calcined, exfoliated MR (circles). Textural data (micropore volume and BET surface area) are given in the insets. The micropore volumes of the exfoliated materials are smaller than those of the corresponding frameworks, reflecting the expected loss of microporosity caused by elimination of micropores between the lamellae. The BET surface area of the exfoliated MWW prepared here is smaller than that previously reported for ITQ-2 (Corma et al., *Nature* 396, 353 (1998); and Wu et al., *J. Phys. Chem. B* 108, 19126 (2004)). The difference may be attributed to the larger degree of fragmentation and/or looser packing (edge to face orientation) of the sheets in ITQ-2 powders (Corma et al., *Nature* 396, 353 (1998)). Similarly, the BET surface area of the exfoliated MFI prepared here is smaller than that of calcined unilamellar and multilamellar MFI (Choi et al., *Nature* 461, 246 (2009)).
Figure 14:
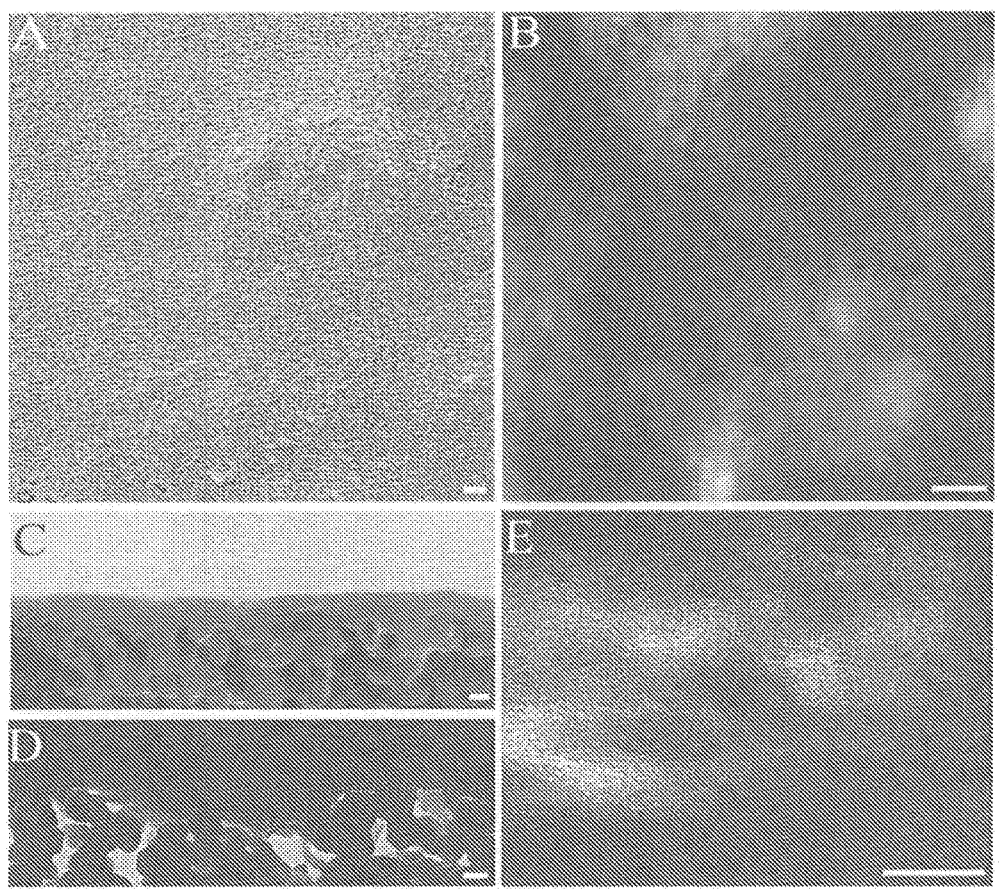
FIG. 14 illustrates images of the MFI film on a homemade porous α-alumina support after the secondary growth of MFI-nanosheet coating. Secondary growth was done at 90° C. for 4.5 hours in a synthesis sol with a composition of $60SiO_2$: 9TPAOH: 8100 $H_2O$: 240 EtOH (aged at 90° C. for 6 hours before being used for secondary growth). (A) SEM image (top-view) of the film. (B) AFM topographical image of the film revealing surface roughness due to approximately 25 nm steps formed on the smooth surfaces of the nanosheets. (C) FIB image of the cross section of the film. The image is taken by a gallium ion source (30 KV) at a tilt angle of 52°. The film is sandwiched between FIB deposited platinum (to protect the coating from milling) and the alumina support. (D) TEM image of the cross section of film. The black layer on top of the coating is FIB deposited platinum. (E) HRTEM image of the coating cross section. The scale bars indicate 200 nm in (A) to (D) and 20 nm in (E).
Figure 15:
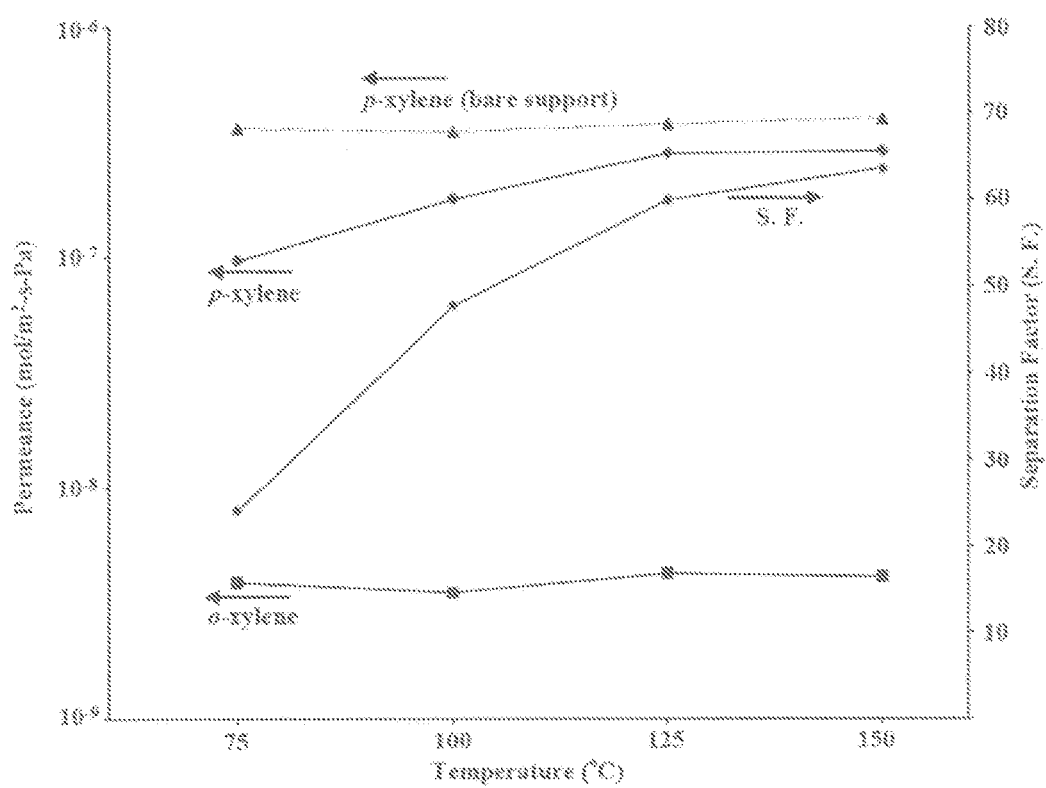
FIG. 15 illustrates p-xylene and o-xylene permeances and p-/o-xylene separation factors versus temperature for one of the five membranes tested. p-xylene permeance through a bare support is given for comparison. Permeation measurements after applying 4 atmosphere transmembrane pressures gave identical results.
Figure 16:
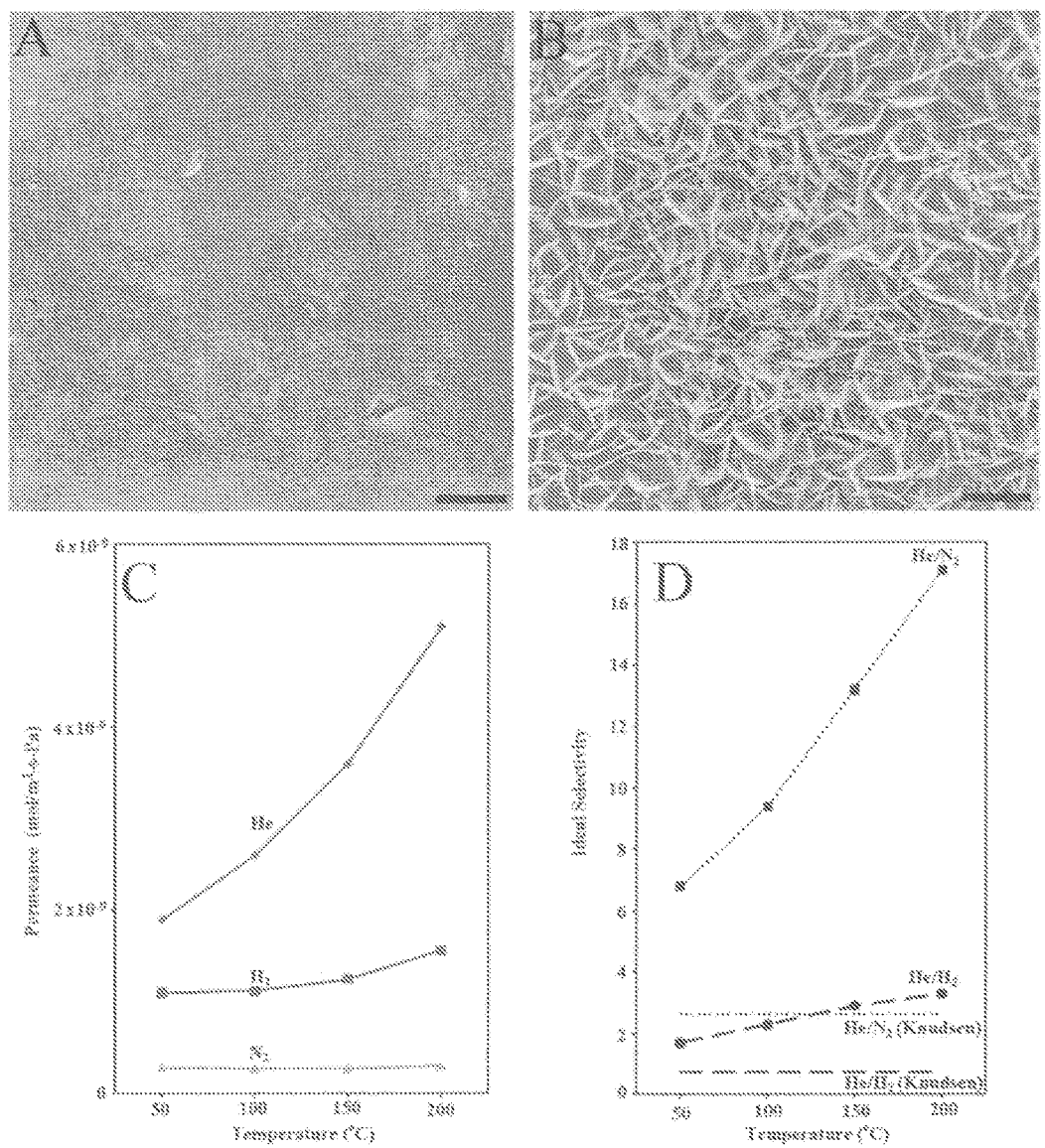
FIG. 16 illustrates (A) SEM image (top-view) of the coating of MWW-nanosheets on a homemade porous α-alumina support. (B) SEM image (top-view) of the MWW film after the secondary growth of the coating in (A). The image in (B) indicates misoriented growth on top of the seed layers of nanosheets. He, $H_2$ and $N_2$ permeances vs. temperature (C) and corresponding ideal selectivities of He/$N_2$ and He/$H_2$ (D). Horizontal lines in (D) represent the expected ideal selectivities of He/$N_2$ (2.6) and He/$H_2$ (0.7) for Knudsen diffusion. Permeation measurements after applying 4 atmosphere trans-membrane pressure gave identical results. The scale bars indicate 200 nm for (A) and 2.0 micron for (B).

The presence of microporosity (FIG. 13) within the MWW and MFI layers imparts unique molecular sieving and hosting capabilities and thus, expands the list of available nanosheets amenable to layer-by-layer assembly (Srivastava et al., *Accounts Chem. Res.* 41, 1831 (2008); and Osada et al., *J. Mater. Chem.* 19, 2503 (2009)) for the fabrication of nanocomposites. Moreover, due to their large lateral area and small thickness, the zeolite nanosheets can coat porous substrates to form well-packed thin deposits. As a result, these nanosheets are attractive materials for the fabrication of thin zeolite membranes. For example, simple filtration of the MFI-nanosheet suspension through an anodized alumina membrane (Anopore, pore size 200 nm) followed by calcination for polymer removal resulted in a uniform, well-packed deposit consisting of highly oriented, overlapping flat nanosheets (FIG. 4A). Even rough porous substrates, such as homemade α-alumina supports with approximately 200 nm pores (Choi et al., *Adsorption* 12, 339 (2006)), can be coated by filtration to obtain smooth films (FIG. 4, B to E). FIG. 4B is a top view scanning electron microscope (SEM) image of an MFI-nanosheet coating on α-alumina indicating uniform surface coverage. Because the nanosheets are very thin, secondary electrons from the underlying nanosheets can be observed marking their morphology and underscoring the overlap. Cross-sections cut by focused ion beam (FIB) were observed by ion beam microscopy (FIG. 4C) and TEM (FIGS. 4, D and E). No penetration of the nanosheets in the interior of the substrate was observed. This is a desirable feature for forming thin zeolite films to achieve high flux membranes. The nanosheets conform to the substrate surface roughness due to their high aspect ratio and nanometer-range thickness. As a result, neither masking of the support pores (Hedlund et al., *J Membr. Sci.* 222, 163 (2003)) nor use of smoothened multilayered (asymmetric) membranes (Lee et al., *J Am. Chem. Soc.* 133, 493 (2011)) or functionalization (Lai et al., *Science* 300, 456 (2003)) is necessary, as in the case of coating from isotropic zeolite nanoparticles or nonisotropic microparticles. However, these films do not show any selectivity for p-/o-xylene, a typical mixture that is widely used to assess the molecular sieving capability of MFI films (Caro et al., *Microporous Mesoporous Mat.* 115, 215 (2008); and Choi et al., *Science* 325, 590 (2009)). It is evident from FIG. 4D and the HRTEM image in FIG. 4E that nanometer-sized gaps exist between the nanosheets. After a single hydrothermal treatment for 4.5 hours at 90° C. under conditions that in the absence of nanosheet coating do not result in an observable deposit (molar composition, 60 $SiO_2$: 9 tetrapropylammonium hydroxide: 8100 $H_2O$: 240 ethanol; aged at 90° C. for 6 hours), the MFI nanosheet film thickness remained unchanged (FIG. 14, A to D), whereas the gaps between the nanosheets were reduced, as suggested by the TEM images of the film crosssection (FIGS. 14, D and E) and an improved separation performance. Five membranes prepared by this method separated xylene isomers (p-xylene from o-xylene) with ap-xylene/o-xylene separation factor of 40 to 70 and p-xylene permeance of 3 $10^{-7}$ mol $m^{-2}s^{-1}$ $Pa^{-1}$ at 150° C. (FIG. 15). Preliminary findings from MWW nanosheet coatings show that a seed layer of similar quality to that of MFI nanosheets can be obtained (FIG. 16A), which, after secondary growth (FIG. 16B), leads to membranes exhibiting molecular sieving properties (FIGS. 16, C and D) with ideal selectivities for $He/H_2$ and $He/N_2$ up to 3 and 17, respectively, which are different from the values expected from Knudsen diffusion and consistent with the small transport-limited aperture of MWW along the c axis.

These findings indicate that the films fabricated using exfoliated zeolite nanosheets exhibit the expected molecular sieving properties and are appropriate to be used as membranes. The exfoliation and purification process described here may also be applicable to other macroporous layered materials to obtain high-aspect-ratio crystalline nanosheets with high purity and uniformity of thickness. Moreover, the simple film formation method introduced, based only on filtration of the nanosheet suspensions, is likely to be easily scalable for large-scale membrane formation on low-cost, commercially available porous supports with large pores and rough surfaces.

The present invention is illustrated by the following examples. It is to be understood that the particular examples, materials, amounts, and procedures are to be interpreted broadly in accordance with the scope and spirit of the invention as set forth herein.

EXAMPLES

Materials and Methods
Synthesis of ITQ-1

ITQ-1 was synthesized following the protocols reported by Camblor et al. (Camblor et al., *J. Phys. Chem. B* 102, 44 (1998)) using N,N,N-trimethyl-1-adamantammonium hydroxide (TMAdaOH). TMAdaOH was obtained by alkylation of 1-adamantylamine (Aldrich) with excess of methyl iodide (Aldrich) at room temperature followed by ion exchange of the iodide salt. For the synthesis of ITQ-1, fumed silica (Cab-O-Sil M5, Cabot Corp.) was mixed with TMAdaOH, hexamethyleneimine (HMI) (Aldrich), NaCl (Aldrich) and distilled water to obtain a gel composition of $SiO_2$: 0.25 TMAdaOH: 0.31 HMI: 0.20 NaCl: 44 $H_2O$. After stirring for 5 hours at room temperature, the resultant gel was transferred to a rotating Teflon-lined steel autoclave at 150° C. Crystallization was stopped after 5 days and the product was obtained by centrifugation. The cake was washed with distilled water to reduce the pH to 9 and dried in a vacuum oven at 130° C.

Swelling of ITQ-1

ITQ-1 was swollen with cetyltrimethylammonium bromide (CTAB) at room temperature using the swelling protocol of MCM-22(P) as reported by Maheshwari et al. (Maheshwari et al., *J. Am. Chem. Soc.* 130, 1507 (2008)). Typically, 1.8 g of ITQ-1 powder was mixed with 35.0 g of an aqueous solution of 29 wt % CTAB (Sigma-Aldrich) and 11.0 g of an aqueous solution of tetrapropylammonium hydroxide (TPAOH) (40% (w/w), Alfa Aesar). The mixture was stirred at room temperature for 16 hours, after which the swollen ITQ-1 was recovered by centrifugation. Excess CTAB and TPAOH were removed by washing the obtained cake with 9 liters of water. The resultant cake was dried in a vacuum oven at 130° C.

Synthesis of Multilamellar Silicalite-1

Multilamellar silicalite-1 was synthesized using the diquaternary ammonium surfactant $[C_{22}H_{45}—N^+(CH_3)_2—C_6H_{12}—N^+(CH_3)_2—C_6H_{13}](OH)_2$ or $C_{22-6-6}(OH)_2$ as reported by Choi et al. (Choi et al., *Nature* 461, 246 (2009)).

$C_{22-6-6}Br_2$ was synthesized by alkylation of N,N,N',N'-tetramethyl-1,6-hexanediamine with 1-bromodocosane at 70° C. followed by alkylation of the resultant product by 1-bromohexane at 85° C. $C_{22-6-6}(OH)_2$ was obtained by ion exchange of the bromide salt. For the synthesis of multilamellar silicalite-1, tetraethyl orthosilicate (TEOS) (Aldrich) was hydrolyzed in the presence of $C_{22-6-6}(OH)_2$ and distilled water to obtain a gel composition of 100 $SiO_2$: 15 $C_{22-6-6}$ $(OH)_2$: 4000 $H_2O$: 400 EtOH. After hydrolysis for 24 hours at room temperature, the resultant gel was transferred to a rotating Teflon-lined steel autoclave at 150° C. Crystallization was stopped after 5 days and the product was obtained by centrifugation. The cake was washed with distilled water to reduce the pH to 9 and dried in a vacuum oven at 130° C.

Exfoliation of CTAB Swollen ITQ-1 and Multilamellar Silicalite-1 to Obtain MWW- and MFI-Nanosheet Nanocomposite, Respectively Both layered zeolites were exfoliated by melt compounding to obtain polymer-zeolite nanocomposite as reported by Maheshwari (Maheshwari, PhD Dissertation, Exfoliated zeolite sheets and block copolymers as building blocks for composite membranes, University of Minnesota (2009)). In a typical exfoliation process, 3.84 g of polystyrene (Mw=45000 g/mol) and 0.16 g of the dried zeolite (CTAB swollen ITQ-1 or multilamellar silicalite-1) were manually mixed and loaded in a vertical, co-rotating twin screw extruder with a recirculation channel (DACA mini compounder). The mixture was blended sequentially at 120° C. for 20 minutes, 170° C. for 25 minutes, 150° C. for 30 minutes, and 200° C. for 20 minutes under a nitrogen environment and at a screw speed of 300 rpm. The MWW- and MFI-nanosheet nanocomposites were then extruded out at 150° C.

Preparation of Coating Suspensions of MWW- and MFI-Nanosheets

Coating suspensions were created by dissolution of the exfoliated zeolite-polymer nanocomposite in toluene followed by dispersion and purification. Typically, 0.10 g of the nanocomposite was dissolved in 8.00 g toluene to make a suspension containing 1.25% polymer (w/w) and 0.05% zeolite (w/w). The suspension was sonicated for 1 hour in a Branson 5510R-DTH ultrasonic cleaner at room temperature to disperse the exfoliated zeolite nanosheets in toluene. The resultant dispersion was centrifuged (12000 relative centrifugal force (RCF) for 10 minutes) to settle down the larger un-exfoliated particles. The solution containing the exfoliated nanosheets was then pipetted out from the centrifuge tube and used as coating suspension.

Coating of Nanosheets on Anopore and α-Alumina Disk

The anodized alumina membrane (Anopore, pore size 200 nm, diameter 13 mm, PCG Scientifics) was coated by 1.5 g of the coating suspension by vacuum filtration using a Millipore Swinnex filter holder (13 mm). Similarly, homemade α-alumina disks (Choi et al., *Adsorption* 12, 339 (2006)) were coated by 4.00 g of MWW-nanosheet suspension or 3.00 g of MFI-nanosheet suspensions. The coated nanosheets of MFI on the Anopore and the α-alumina disks were calcined at 540° C. for 6 hours and MWW coating was calcined at 580° C. for 4 hours to remove residual polymer and structure-directing agents.

Secondary Growth of Films on the α-Alumina Disk

The MFI-nanosheet coating on the α-alumina disk was hydrothermally grown to reduce inter-particle gaps. In a typical secondary growth, TEOS (Aldrich) was hydrolyzed for 4 hours at room temperature in the presence of TPAOH (1.0 M, Aldrich) and distilled water to obtain a synthesis sol with a composition of 60 $SiO_2$: 9 TPAOH: 8100 $H_2O$: 240 EtOH. The synthesis sol was aged at 90° C. for 6 hours in a Teflon-lined autoclave. Then, the MFI-nanosheet coating was placed vertically in this aged sol, and heated at 90° C. for 4.5 hours in a Teflon-lined autoclave. The membrane was then calcined at 480° C. for 4 hours with temperature ramp rate of 0.5° C./minute to remove the TPAOH from the framework.

MWW-nanosheet coating was also secondary grown to fill the inter-particle gaps. Typically, a mixture of 0.28 g fumed silica (Cab-O-Sil M5, Cabot Corp.), 9.82 g of TMAdaOH (0.38 molar), 10.20 g distilled water, 0.17 g NaCl (Aldrich) and 0.46 g HMI (Aldrich) was stirred overnight at room temperature. Alumina disk coated with MWW-nanosheets was placed in the mixture and autoclaved at 150° C. for 21 hours. The membrane was then dried overnight at room temperature and calcined at 540° C. for 4 hours.

Characterization

A FEI Tecnai T12 transmission electron microscope (TEM) operated at 120 kV and a FEI Tecnai $G^2$ F30 TEM operated at 300 kV were used for TEM studies. All images were recorded using CCD cameras. 50 nm thin sections of the nanocomposites were prepared by a Leica EM UC6 Ultramicrotome equipped with a diamond knife. The sections were then mounted on a TEM grid (400 mesh Cu, PELCO). For examining morphology of the nanosheets and high-resolution TEM, a drop of nanosheets suspension in toluene was deposited on a TEM grid (ultrathin carbon film on holey carbon support film, 400 mesh Cu, Ted Pella) and was air-dried.

For AFM, muscovite mica was etched in 50% HF for 4 hours to generate the 2.0 and 1.0 nm steps (Nagahara et al., *J. Vac. Sci. Technol. B* 12, 1694 (1994)), which were used as a standard in determining the nanosheet thickness. Nanosheet specimens for AFM were prepared by placing a drop of their suspension on freshly cleaved muscovite mica followed by calcination in air at 540° C. for 6 hours. A Molecular Imaging PicoPlus scanning probe microscope (since renamed Agilent 5500 AFM/SPM system) was used for imaging. AFM tips were used as obtained from AppNano (Fort-10, Si, N type, uncoated). AFM was done in tapping mode in the repulsive regime. The image analysis was performed with the Gwiddion 2.22 software.

X-ray diffraction (XRD) patterns were collected using a Bruker-AXS (Siemens) D5005 diffractometer using CuKα radiation. Small angle XRD measurements were done on a homemade pinhole diffractometer using CuKα radiation. Scanning electron microscopy (SEM) was done using a Hitachi S-900 instrument after the samples were coated with 3 nm of platinum. Cross section of the supported films for SEM and TEM were prepared using a focused ion beam (FIB) SEM instrument (Quanta 3D DualBeam). $N_2$ adsorption-desorption isotherms were collected at 77 K on an Autosorb iQ-Chemi system (Quantachrome Instruments). Micropore volume was extracted by conventional tplot method (thickness 3.7-5 Å) and BET surface area was calculated in the relative pressure range of 0.05-0.3. $^{29}Si$ MAS NMR spectrum was obtained from a Bruker DSX-500 solid state NMR spectrometer.

Permeation Measurements

Xylene isomer vapor permeation measurements were made in the Wicke-Kallenbach mode (stainless steel permeation cell fitted inside a Thermolyne 48000 furnace) using 180 ml/minute of Helium carrier containing equimolar feed of p-xylene (0.5 KPa) and o-xylene (0.5 KPa) (Choi et al., *Adsorption* 12, 339 (2006)). The separation factor is defined as the molar ratio of isomers in the permeate over the molar ratio in the feed.

For single gas permeation measurements, membranes were placed into a custom made stainless steel permeation cell and sealed with silicone O-rings. The cell was then placed in a temperature controlled oven. The outlet of the permeate side is connected to a section with a calibrated volume connected to a sensitive pressure transducer. It is subsequently connected to a vacuum pump. Initially, the permeate side is at vacuum and the feed side is at 1 atmosphere. Typical feed side flow rates were 250 cc/min. The permeate side is then isolated from vacuum and the rate of change in pressure was measured with the pressure transducer connected to a computer. The flow rate through the membrane is calculated from the recorded change in pressure with time and use of the calibrated volume. All measurements were taken in the range of 0-20 torr and 1 atmosphere at feed and permeate sides, respectively. Several runs were made with increasing and decreasing temperature sequences for each gas to check for stability and consistency.

Structure Construction and Optimization

The zeolite nanosheet structures were optimized using damped-dynamics simulations by the Car-Parrinello molecular dynamics (CPMD) code in the Quantum ESPRESSO package (Giannozzi et al., *J Phys.: Condes. Matter* 21, (2009)). All periodic calculations were performed using the Perdew-Burke-Ernzerhof (PBE) generalized gradient approximation (GGA) (Perdew et al., *Phys. Rev. Lett.* 77, 3865 (1996)) of the exchange-correlation functional. To describe the interaction of valence electrons with ionic cores, we employed ultrasoft pseudopotentials. The calculation required kinetic energy cutoffs, of 40 Ry and 320 Ry for wave functions and charge density, respectively. The Brillouin zone sampling was restricted to the F-point.

The definition of MWW unit cell and atomic coordinates used to generate the ITQ-1 nanosheet structure were from Camblor et al. (Camblor et al., *J. Phys. Chem. B* 102, 44 (1998)) The structure of ITQ-1 nanosheets was proposed as one unit cell-thick (FIG. 10A), as by Corma et al., *Microporous Mesoporous Mater.* 38, 301 (2000). A thin fragment of the nanosheet highlighted with purple in FIG. 10A was used to represent the part of the nanosheet that will undergo structural change upon optimization. The dangling bonds on both exterior and interior sides of the fragment were terminated with hydroxyl groups (with terminal O—H bond length initially set to 98 pm, and Si—O—H bond angle set to its corresponding Si—O—Si bond angle in the original unit cell), resulting in 63 atoms in the cluster. The terminal hydroxyl groups on the interior side were kept fixed, and the other atoms were allowed to relax. Periodic boundary conditions were applied in three dimensions: the cluster is bonded with adjacent unit cells perpendicular to c direction, but is separated with a vacuum layer along the c direction (the thickness of the vacuum layer is chosen as 21.6 Å, 5 times the thickness of the cluster). In the structural optimization, the lattice parameters were kept constant, and the convergence criteria for ionic position optimization were chosen as $10^{-4}$ a.u. for total energy, and $10^{-6}$ a.u. for electron kinetic energy.

The definition of MFI unit cell and atomic coordinates are from van Koningsveld et al., *Zeolites* 10, 235 (1990)). The structure of the silicalite-1 nanosheets was chosen as three (010) pentasil layers along the b direction (1.5 unit cell thick, as in FIG. 10B). For structure optimization, one (010) pentasil layer at the surface was chosen as a cluster. Similar to MWW cluster, the dangling bonds on both exterior and interior sides were terminated with hydroxyl groups with terminal O—H bond lengths and Si—O—H bond angles treated in the same manner, resulting in a cluster with 168 atoms. The interior terminal hydroxyl groups were kept fixed, and the other atoms were allowed to relax. Periodic boundary conditions were applied in three dimensions, where the pentasil layer clusters were separated with a vacuum layer of thickness 59.6 Å, 5 times the thickness of the cluster. In the structural optimization, the lattice parameters were kept constant, and the convergence criteria for ionic position optimization were chosen as $10^{-4}$ a.u. for total energy, and $1.5\times10^{-5}$ a.u. for electron kinetic energy.

Alternatively, a structure that is 1 unit cell thick (contains one complete and two incomplete (010) pentasil layers) was also chosen for comparison (FIG. 10C).

The structure optimization was performed similarly to the 1.5 unit cell thick structure, except that the incomplete pentasil layer was chosen as the cluster for structure optimization, which results in a cluster with 108 atoms. Periodic boundary conditions were applied in three dimensions, where the clusters were separated with a vacuum layer of thickness 29.8 Å, 5 times the thickness of the cluster. In the structural optimization, the lattice parameters were kept constant, and the convergence criteria for ionic position optimization were chosen as $10^4$ a.u. for total energy, and $10^{-6}$ a.u. for electron kinetic energy.

The optimized surface structures were adopted into the initial structures to generate nanosheets of various thicknesses.

XRD Pattern Simulation

XRD patterns were simulated using powder power theorem (Schlenker et al., *J Appl. Crystallogr.* 29, 178 (1996)) implemented with UDSKIP (UDSKIP algorithm to calculate theoretical Powder X-Ray diffraction patterns of ultra-small zeolite crystals on the world wide web at che.udel.edu/research_groups/nanomodeling/resources.html; and Kragten et al., *J. Phys. Chem. B* 107, 10006 (2003)). In the simulation, MWW nanosheets were modeled as 50 50 n (n=1, 2, and 3) unit cells with relaxed surface structure, and MFI nanosheets were modeled as 50 n 50 (n=1, 1.5, 2.5, and 3.5) unit cells with relaxed surface structure. Simulations for wide-angle X-ray diffraction were carried out with step size $\Delta(2\theta)=0.01°$ (Cu Kβ1 radiation, $\lambda=1.5418$ Å).

TEM Image/Diffraction Pattern Simulation

Simulation of electron diffraction (ED) patterns and TEM images was performed using Multislice method (Cowley et al., *Acta Crystallogr.* 10, 609 (1957); Kirkland et al., *Ultramicroscopy* 23, 77 (1987); and Loane et al., *Acta Crystallogr. Sect. A* 47, 267 (1991)) with the code developed by Kirkland (E. J. Kirkland, *Advanced Computing in Electron Microscopy* (Springer, New York, ed. 2nd, 2010)).

For simulation, an orthorhombic MWW unit cell is reconstructed from the hexagonal MWW unit cell: $a_o=\sqrt{3}\,a_h$, $b_o=a_h$, $c_o=c_h$, where $a_o$, $b_o$, and $c_o$ are the lattice parameters for the orthorhombic MWW unit cell, and $a_h$ and $c_h$ are the lattice parameters for the hexagonal MWW unit cell. The nanosheet size is chosen as 24.6 nm ($a_o$)×24.2 nm ($b_o$) with desired thicknesses. A vacuum layer was placed around the crystal to extend the crystal to a supercell with 34.4 nm×34.4 nm, and periodic boundary conditions were applied in two dimensions (perpendicular to beam) to the super cell. A grid of 11700 11700 pixels was used in these simulations. In order to generate the projected atomic potentials, the crystal was automatically sliced along the c direction to 1 Å slices with autoslic module provided with the code.

For MFI, the nanosheet size is chosen as a=10.8 nm and c=13.4 nm with desired thicknesses. A vacuum layer was placed around the crystal to extend the crystal to a supercell with a=c=18.8 nm, and periodic boundary conditions were applied in two dimensions (perpendicular to beam). A grid of 6724 6724 pixels was used in these simulations. In order to generate the projected atomic potentials, the crystal was automatically sliced along the b direction to 1 Å slices with autoslic module provided with the code.

Acceleration voltage (300 kV) and spherical aberration coefficient (Cs=1.2 mm) were used as microscope parameters for simulation of electron diffraction patterns. The temperature of the simulation was set to 300 K, where thermal vibration was introduced in the simulation by randomly displacing the atoms according to their Debye-Waller factors (Butt et al., *Acta Cryst.* A44, 396 (1988)).

The simulated MWW and MFI electron diffraction patterns were convolved with a normalized Gaussian function with a FWHM of 0.003 Å$^{-1}$ and 0.01 Å$^{-1}$, respectively, as an approximate approach to account for the convergence of the electron beams at actual operating conditions.

The complete disclosure of all patents, patent applications, and publications, and electronically available material cited herein are incorporated by reference. The foregoing detailed description and examples have been given for clarity of understanding only. No unnecessary limitations are to be understood therefrom. The invention is not limited to the exact details shown and described, for variations obvious to one skilled in the art will be included within the invention defined by the claims.

What is claimed is:

1. A method of making a film of a zeolite, the method comprising:
   providing a composite comprising a layered zeolite having an MFI type framework and a polymer, wherein the layers of the zeolite are exfoliated by the polymer;
   contacting the composite with a solvent under conditions effective to dissolve the polymer and provide a suspension of nanosheets of the zeolite in the solvent to provide a suspension of an exfoliated layered zeolite having an MFI type framework in a solvent; and
   filtering the suspension through a porous support to provide a film of the zeolite on the porous support.

2. The method of claim 1 further comprising calcining the zeolite at a temperature of 400° C. to 700° C. for 1 hour to 48 hours.

3. The method of claim 1 wherein conditions effective further comprise sonicating the nanosheets of the zeolite in the solvent to disperse the nanosheets in the solvent.

4. The method of claim 1 wherein providing the composite comprising the layered zeolite and the polymer comprises:
   providing a layered zeolite; and
   melt blending the layered zeolite with the polymer.

5. The method of claim 1 wherein the polymer is selected from the group consisting of polystyrene, polypropylene, a polyolefin, a polymethacrylate, polyvinylalcohol, a polyacrylamide, a polycaprolactone, a copolymer of ethylene, a copolymer of propylene, a copolymer of acetate, poly(ethylene terephthalate), a nylon, a polysulfone, a polyimide, a polyamidimide, a polybenzaimidazole, and combinations thereof.

6. The method of claim 1 wherein conditions effective to dissolve the polymer comprise a temperature of no greater than 200° C.

7. The method of claim 1 wherein conditions effective to dissolve the polymer comprise a temperature of no greater than 100° C.

8. The method of claim 1 wherein conditions effective to dissolve the polymer comprise a temperature of about room temperature.

9. The method of claim 1 wherein the solvent is an organic solvent.

* * * * *